(12) United States Patent
Hong et al.

(10) Patent No.: US 7,777,265 B2
(45) Date of Patent: Aug. 17, 2010

(54) SEMICONDUCTOR DEVICE HAVING CONTACT BARRIER AND METHOD OF MANUFACTURING THE SAME

(75) Inventors: Hyeong-Sun Hong, Gyeonggi-do (KR); Jae-Goo Lee, Gyeonggi-do (KR); Dong-Hyun Kim, Gyeonggi-do (KR); Sung-Un Kwon, Jeollabuk-do (KR); Sang-Joon Park, Seoul (KR); Nam-Jung Kang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 51 days.

(21) Appl. No.: 11/933,039

(22) Filed: Oct. 31, 2007

(65) Prior Publication Data

US 2008/0088029 A1 Apr. 17, 2008

Related U.S. Application Data

(60) Continuation-in-part of application No. 11/751,515, filed on May 21, 2007, now Pat. No. 7,488,644, and a division of application No. 11/143,197, filed on Jun. 1, 2005, now Pat. No. 7,307,305, and a division of application No. 10/697,722, filed on Oct. 29, 2003, now Pat. No. 6,916,738.

(30) Foreign Application Priority Data

| Feb. 24, 2003 | (KR) | ................................ 2003-11310 |
| May 11, 2007 | (KR) | ...................... 10-2007-0046193 |

(51) Int. Cl.
*H01L 27/108* (2006.01)
(52) U.S. Cl. ......................... 257/296; 257/776; 257/905
(58) Field of Classification Search ................. 257/296, 257/776, 905
See application file for complete search history.

(56) References Cited

U.S. PATENT DOCUMENTS 5,500,080 A 3/1996 Choi (Continued)

FOREIGN PATENT DOCUMENTS

JP 2001-217405 8/2001

(Continued)

OTHER PUBLICATIONS

English language abstract of Japanese Publication No. 2001-217405.

(Continued)

*Primary Examiner*—Long Pham
(74) *Attorney, Agent, or Firm*—Muir Patent Consulting, PLLC

(57) ABSTRACT

A semiconductor device having a contact barrier for insulating contacts with a large aspect ratio and having a fine pitch between adjacent conductive lines and a method of manufacturing the same are provided. The semiconductor device includes a buried contact formed in a region between two adjacent first conductive lines and two adjacent second conductive lines. Insulating lines define a width of the buried contact. To form the contact barrier, an interlayer dielectric layer formed on the second conductive lines is patterned to form a space and an insulating line having an etching ratio different from the interlayer dielectric layer is formed in the space. The interlayer dielectric layer is selectively wet etched relative to an insulating layer covering the second conductive line and the first insulating line to form buried contact hole. The buried contact hole is filled with conductive material to form a buried contact.

18 Claims, 18 Drawing Sheets

U.S. PATENT DOCUMENTS

| | | |
|---|---|---|
| 5,879,986 A | 3/1999 | Sung |
| 6,093,641 A | 7/2000 | Park |
| 6,214,715 B1 | 4/2001 | Huang et al. |
| 6,458,692 B1 | 10/2002 | Kim |
| 6,573,168 B2 | 6/2003 | Kim et al. |
| 2002/0090792 A1 | 7/2002 | Wu et al. |
| 2004/0188806 A1 | 9/2004 | Chung et al. |

FOREIGN PATENT DOCUMENTS

| | | |
|---|---|---|
| JP | 2004-260166 | 9/2004 |
| KR | 2002-0001328 | 1/2002 |
| KR | 2004-0017982 | 3/2004 |
| KR | 2004-0069663 | 8/2004 |

OTHER PUBLICATIONS

English language abstract of Korean Publication No. 2002-0001328.
English language abstract of Korean Publication No. 2004-0017982.
English language abstract of Korean Publication No. 2004-0069663.
English language abstract of Japanese Publication No. 2004-260166.

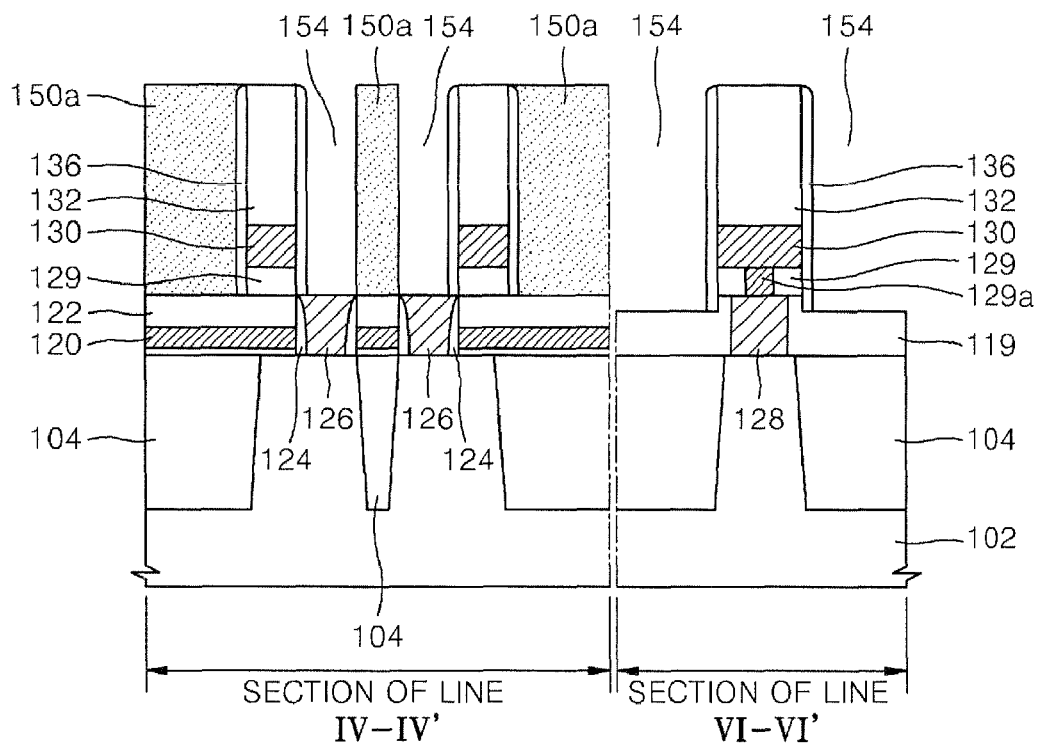
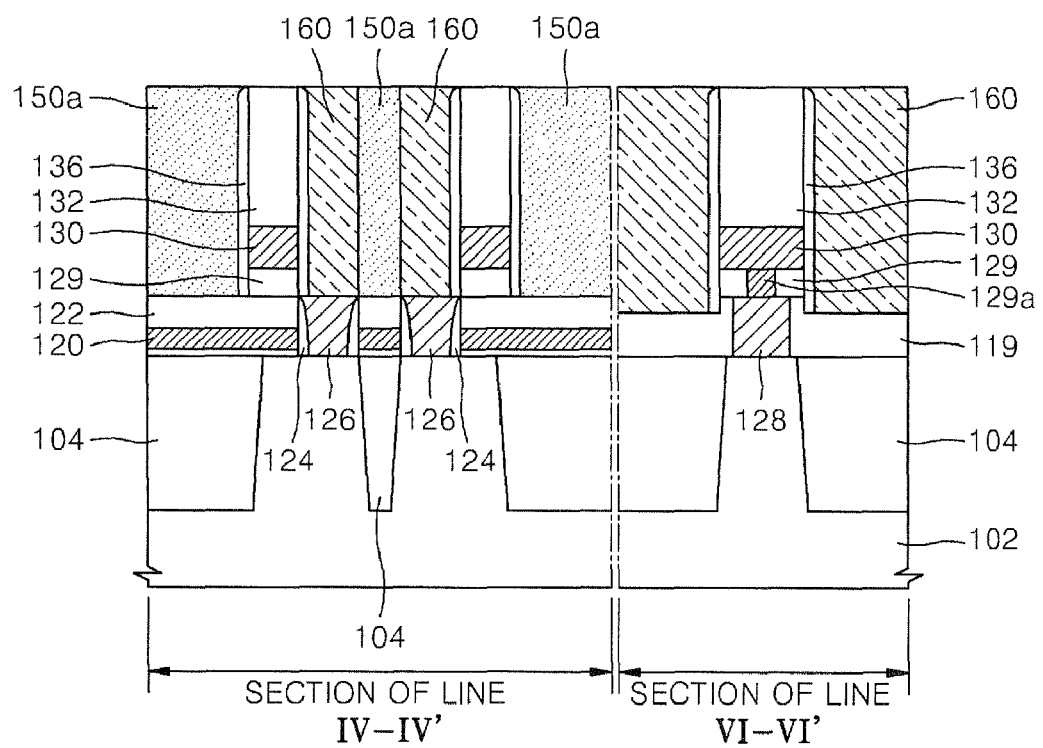

SEMICONDUCTOR DEVICE HAVING CONTACT BARRIER AND METHOD OF MANUFACTURING THE SAME

CROSS-REFERENCE TO RELATED PATENT APPLICATION

This application is a continuation-in-part of U.S. patent application Ser. No. 11/751,515, filed on May 21, 2007, now pending, which is a divisional of U.S. patent application Ser. No. 11/143,197, filed on Jun. 1, 2005, now pending, which is a divisional of U.S. patent application Ser. No. 10/697,722, filed on Oct. 29, 2003, now U.S. Pat. No. 6,916,738, issued on Jul. 12, 2005, which claims priority from Korean Patent Application No. 2003-11310, filed on Feb. 24, 2003, and also claims the benefit of foreign priority to Korean Patent Application No. 2007-46193, filed on May 11, 2007, the disclosures of which are incorporated herein in their entirety by reference.

BACKGROUND

1. Field of Invention

Embodiments of the present invention relate generally to semiconductor devices having contact barriers and methods of manufacturing the same. More particularly, embodiments of the present invention relate to a semiconductor device including contacts with a large aspect ratio, repeatedly formed to have a fine pitch in a highly integrated semiconductor device, and a method of manufacturing the same.

2. Description of Related Art

As the integration density of semiconductor devices increases, the thickness of interlayer dielectric layers gradually increases and the aspect ratio of contact holes electrically connecting different conductive layers to each other gradually increases. Thus, in a photolithographic process, an aspect ratio of the contact hole, i.e., a ratio of a length of a hole relative to its diameter, is increased while an alignment margin of the contact hole decreases. As a result, it is difficult to form fine contact holes for implementing highly integrated devices using conventional photolithography processes.

For example, when forming a dynamic random access memory (DRAM), a plurality of bit lines are formed to extend along a predetermined direction and then a buried contact is formed to electrically connect a storage electrode of a capacitor located on each of the bit lines to an active region of a semiconductor substrate between the plurality of bit lines. According to such a conventional method, a space between the buried contact and the bit line is very small. For this reason, an electrical short circuit between the buried contact and the bit line may occur. A problem associated with forming buried contacts using a conventional method of manufacturing a semiconductor device will be discussed with reference FIGS. 1 and 2A through 2C.

FIG. 1 is a schematic view of a conventional semiconductor device. FIGS. 2A through 2C are cross-sectional views taken along line II-II' shown in FIG. 1 and sequentially illustrate a method of manufacturing the conventional semiconductor device of FIG. 1.

Referring to FIGS. 1 and 2A through 2C, reference numeral 10 denotes an active region defined by an isolation region 4 in a semiconductor substrate 2, reference numeral 20 denotes a word line, reference numeral 30 denotes a bit line, reference numeral 12 denotes a first self-aligning contact (hereinafter, referred to as a "first SAC") formed by the word line 20 through a self-alignment method, reference numeral 14 denotes a second self-aligning contact (hereinafter, referred to as a "second SAC") formed by the word line 20 through a self-alignment method and reference numeral 40 denotes a buried contact electrically connected to the active region 10 of the semiconductor substrate 2 through the first SAC 12 in a space between two adjacent bit lines 30.

With reference to FIG. 2A, the semiconductor device illustrated in FIG. 1 is manufactured by first forming a first interlayer dielectric layer 28 made of an oxide layer on a plurality of word lines 20 extending along a predetermined direction on the semiconductor substrate 2 (e.g., extending along the y-direction in FIG. 1) and then forming a plurality of bit lines 30 on the first interlayer dielectric layer 28. The bit line 30 extends in a direction perpendicular to the word lines 20 (e.g., extending along the x-direction in FIG. 1). The top surface and sidewalls of the bit lines 30 are respectively covered by a capping layer 32 and an insulating spacer 34, which are formed of a nitride. A second interlayer dielectric layer 36 made of an oxide layer is formed on the plurality of bit lines 30.

As shown in FIG. 2B, a photoresist pattern 38 is then formed on the second interlayer dielectric layer 36 and a contact hole 38a, for forming the buried contact 40, is then formed by anisotropically dry etching the first and second interlayer dielectric layers 28 and 36 using the photoresist pattern 38 as an etching mask. When observed from the top surface of the semiconductor substrate 2, a contact hole formation region "A" opened by the photoresist pattern 38 overlaps with the bit line 30 by a predetermined width W. When anisotropically dry etching the first and second interlayer dielectric layers 28 and 36 using the photoresist pattern 38 as an etching mask, the first and second interlayer dielectric layers 28 and 36 are etched in such a manner that they are self-aligned by the capping layer 32 and the insulating spacer 34 that cover the bit line 30. As a result, the contact hole 38a is formed having a sectional profile shown in FIG. 2B. However, while the first and second interlayer dielectric layers 28 and 36 are etched, a large portion of the capping layer 32 and the insulating spacer 34 around the bit line 30 is consumed, particularly at a corner region of the bit line 30, due to the tolerance limit with respect to dry etching of the capping layer 32 and the insulating spacer 34. As a result, the corner of the bit line 30 may be undesirably exposed because the total depth of the contact hole 38a is typically very deep (i.e., about 4000 Å to 4500 Å). Further, after forming the contact hole 38a, the thickness distribution of the capping layer 32 and the insulating spacer 34 that remain around the bit line 30 becomes poor depending on a position of a wafer due to the limits of etching equipment under such etching conditions.

As shown in FIG. 2C, the buried contact 40 is formed by filling a conductive material in the contact hole 38a. Given the poor state of the thickness distribution of the capping layer 32 and the insulating spacer 34 remaining around the bit line 30, either a short circuit between the bit line 30 and the buried contact 40 occurs at a shoulder portion "S" of the bit line 30 when filling the conductive material in the contact hole 38a or the rate of failures in subsequent processes is increased due to the potential possibility of a short circuit at the shoulder portion "S". To lower the rate of failures, previous attempts have been made to form an insulating spacer again on the sidewall of the bit line 30 after forming the contact hole 38a. In such a method, however, the bottom area of the buried contact 40 becomes undesirably narrow. As a result, the contact area of the buried contact 40 and the first SAC 12 is reduced, which increases the contact resistance of the buried contact 40 and the first SAC 12.

SUMMARY

Exemplary embodiments of the present invention can be characterized as providing a highly integrated semiconductor device having various layouts and having a structure in which short circuits between a contact with a large aspect ratio and a conductive layer around the contact and failures generated due to the short circuits can be prevented. Exemplary embodiments of the present invention can also be characterized as providing a method of manufacturing a highly integrated semiconductor device having various layouts, which can prevent short circuits between a contact with a large aspect ratio and a conductive layer around the contact and failures generated due to the short circuits.

One embodiment exemplarily described herein may be characterized as a semiconductor device that includes a semiconductor substrate having active regions formed thereon; first conductive lines extending over at least one of the active regions along a first direction; second conductive lines extending over the first conductive lines along a second direction; a buried contact electrically connected to the at least one of the active regions, the buried contact disposed in a region defined between a first pair of adjacent ones of the first conductive lines and between a pair of adjacent ones of the second conductive lines; and first insulating lines extending over the first pair of adjacent ones of the first conductive lines along the first direction, wherein the first insulating lines define a width of the buried contact along the second direction.

Another embodiment exemplarily described herein may be characterized as a semiconductor device that includes a semiconductor substrate having active regions formed thereon; first conductive lines extending over the semiconductor substrate along a first direction; second conductive lines extending over the first conductive lines along a second direction; first contacts formed on corresponding ones of the active regions, the first contacts disposed between pairs of adjacent ones of the first conductive lines; second contacts electrically connected to corresponding ones of the first contacts, the second contacts disposed between pairs of adjacent ones of the second conductive lines; and first insulating lines extending over the first pair of adjacent ones of the first conductive lines along the first direction and disposed between pairs of adjacent ones of the second conductive lines, wherein the first insulating lines insulate adjacent ones of the second contacts.

Still another embodiment exemplarily described herein may be characterized as a method of manufacturing a semiconductor device that includes forming first conductive lines extending along a first direction on a semiconductor substrate having a plurality of active regions defined thereon; forming second conductive lines extending over the first conductive lines along a second direction, the second conductive lines comprising top surfaces and sidewalls covered by an insulating layer; forming an interlayer dielectric layer on the second conductive lines; patterning the interlayer dielectric layer to form line-shaped first spaces extending along the first direction; forming first insulating lines in the first spaces, the first insulating lines comprising a material having an etching selectivity different from an etching selectivity of the interlayer dielectric layer; wet etching the interlayer dielectric layer using the insulating layer and the first insulating lines as an etching mask to form contact holes spaced apart from the second conductive lines; and filling a conductive material in the contact holes to form buried contacts electrically connected to the active regions.

BRIEF DESCRIPTION OF THE DRAWINGS

The above and other features of embodiments of the present invention will become more apparent by describing in detail exemplary embodiments thereof with reference to the attached drawings in which:

FIGS. 6A through 6G are cross-sectional views taken along lines IV-IV' and VI-VI' shown in FIG. 3 and sequentially illustrate another exemplary method of manufacturing the semiconductor device shown in FIGS. 3 and 4;

DETAILED DESCRIPTION

Figure 1:
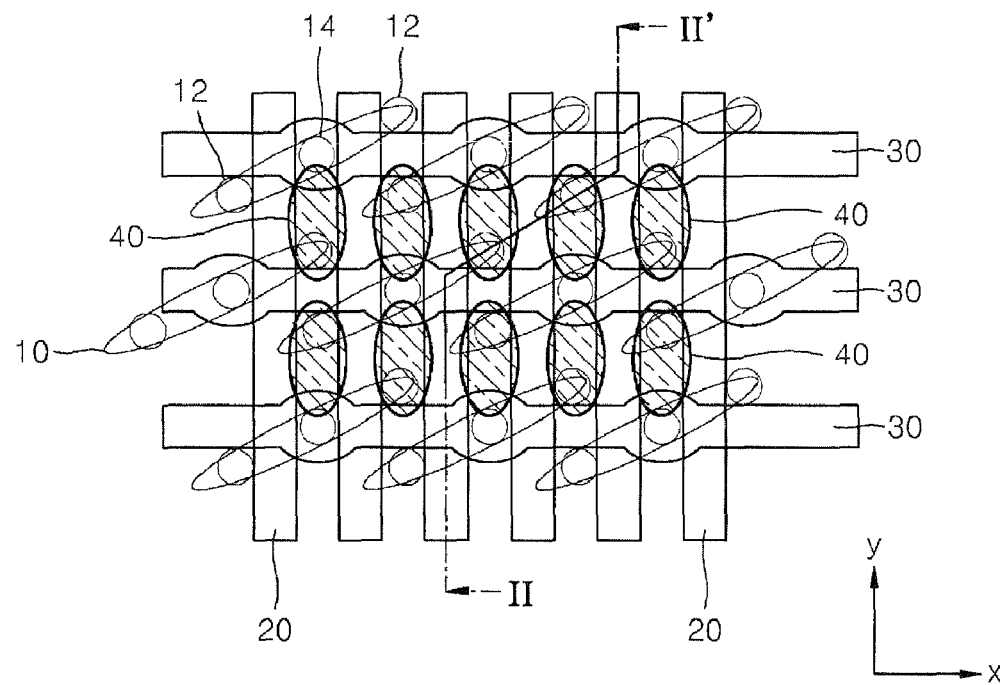
FIG. 1 is a schematic view of a conventional semiconductor.
Figure 2A:
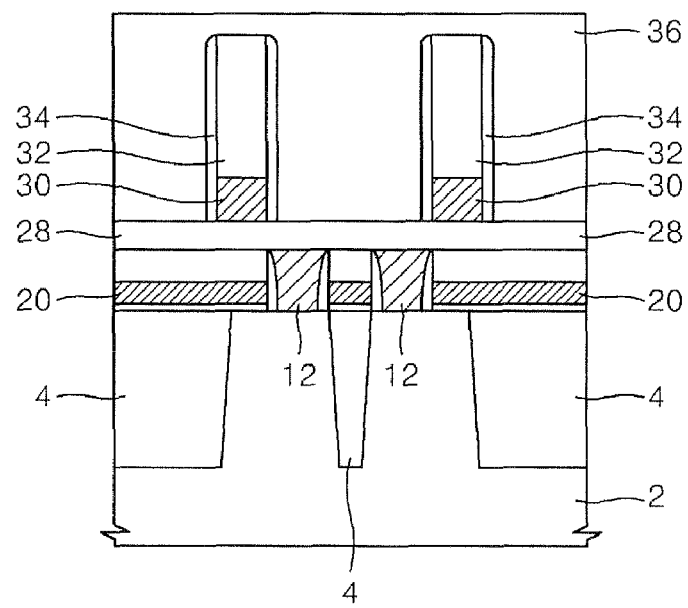
FIGS. 2A through 2C are cross-sectional views taken along line II-II' shown in FIG. 1 and sequentially illustrate a method of manufacturing the conventional semiconductor device of FIG. 1.
Figure 2B:
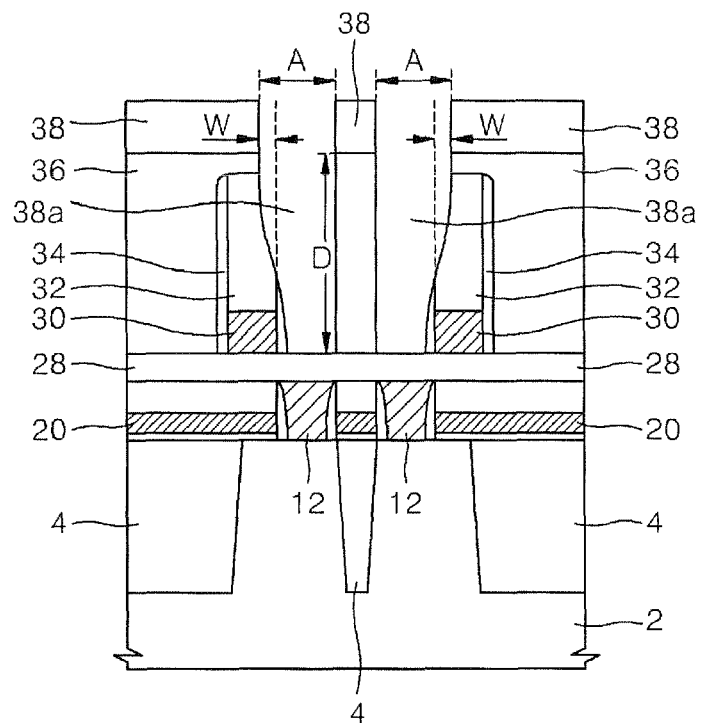
Figure 2C:
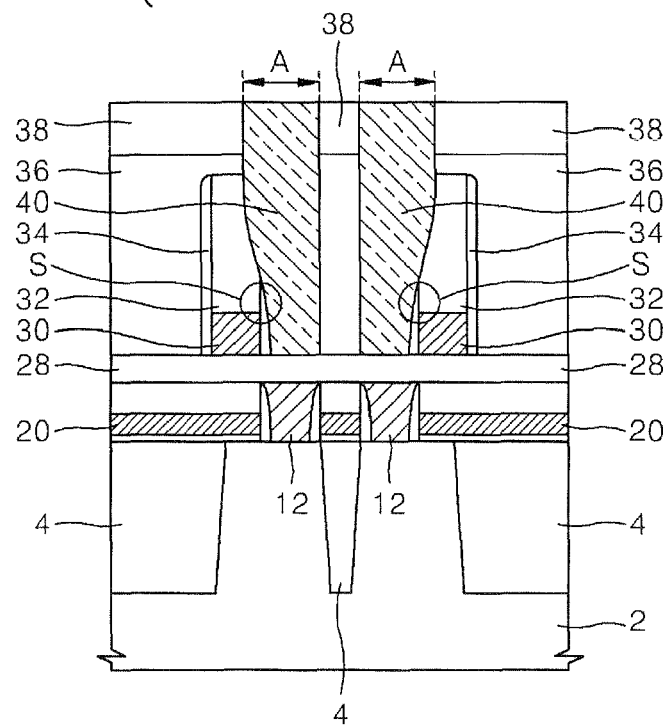

Embodiments of the present invention will now be described more fully hereinafter with reference to the accompanying drawings, in which preferred embodiments of the invention are shown. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers, films and regions are exaggerated for clarity. Like numbers refer to like elements throughout the specification.

Figure 3:
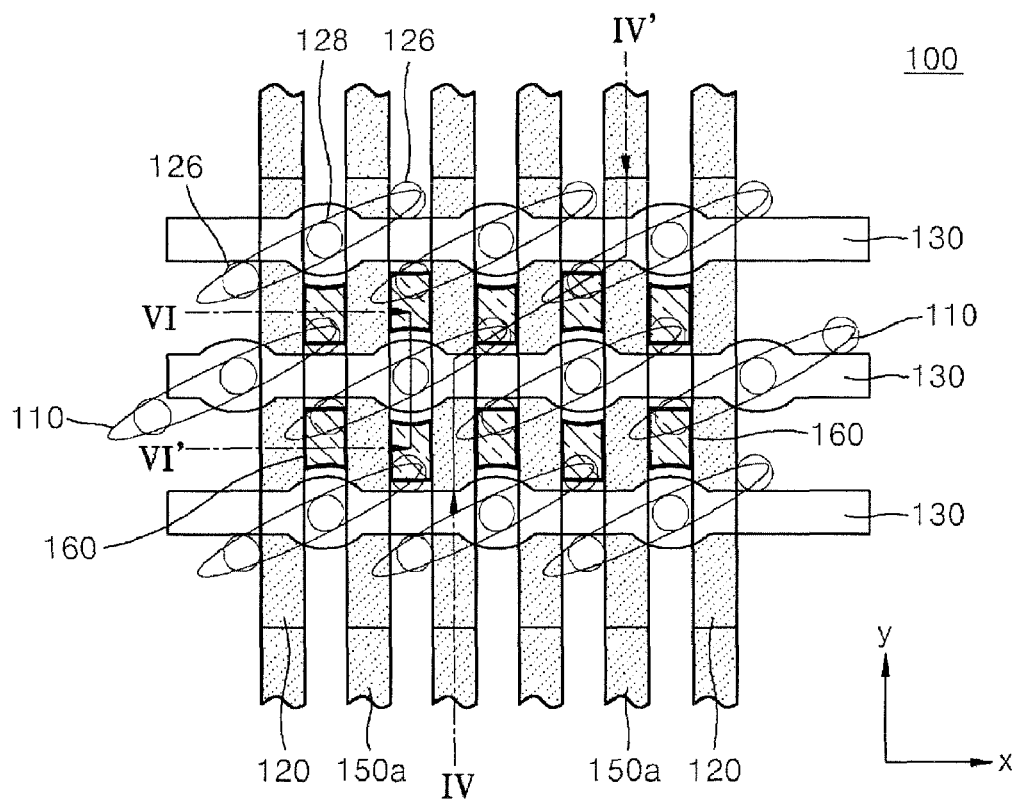
FIG. 3 is a schematic view of a semiconductor device according to one embodiment.
Figure 4:
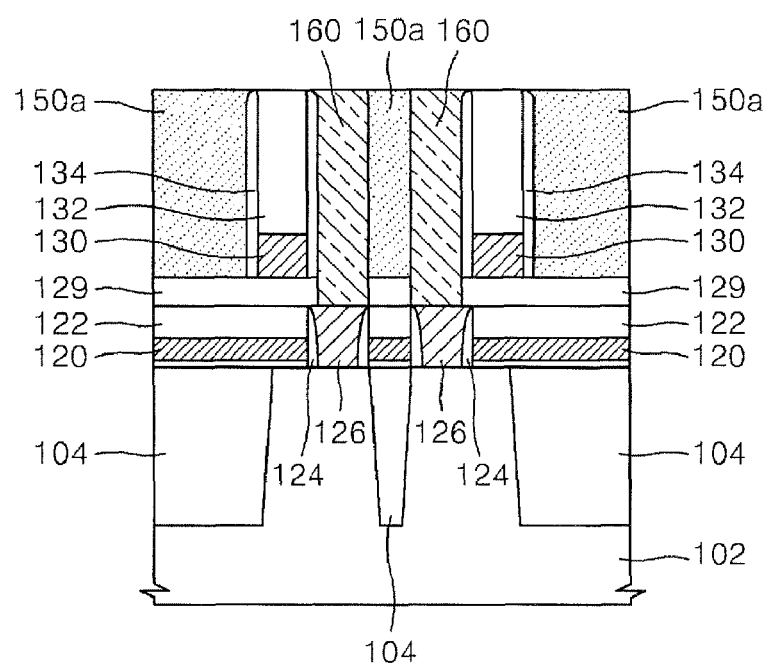
FIG. 4 is a cross-sectional view taken along line IV-IV' shown in FIG. 3.

FIG. 3 is a schematic view of a semiconductor device according to one embodiment. It will be appreciated that the semiconductor device schematically illustrated in FIG. 3 may be applied to a memory cell having, for example, a unit cell size of $6F^2$. FIG. 4 is a cross-sectional view taken along line IV-IV' shown in FIG. 3.

Referring to FIGS. 3 and 4, a semiconductor device 100 according to one embodiment may, for example, include a plurality of word lines 120 extending along a first direction (e.g., a "y"-direction) over a semiconductor substrate 102 having a plurality of active regions 110 defined by an isolation region 104. A plurality of bit lines 130 extend along a second direction (e.g., an "x"-direction) that is perpendicular (or substantially perpendicular) to the first direction. The top surfaces and sidewalls of the word lines 120 are covered by a first capping layer 122 and a first insulating spacer 124, respectively. The top surfaces and sidewalls of the bit line 130 are covered by a second capping layer 132 and a second insulating spacer 134, respectively. Each of the first capping layer 122, the first insulating spacer 124, the second capping layer 132 and the second insulating spacer 134 may include a material such as, for example, a nitride. In one embodiment, each of the first capping layer 122, the first insulating spacer 124, the second capping layer 132 and the second insulating spacer 134 may be formed as a nitride layer.

Two word lines 120 extend parallel (or substantially parallel) with each other along the y-direction over the same active region 110. Two first self-aligning contacts (SACs) 126 are formed between two adjacent word lines 120 located over the same active region 110. A second SAC 128 is also formed between two adjacent word lines 120 located over the active region 110. The respective first and second SACs 126 and 128 are connected to the active region 110 and may be formed so as to be self-aligned with respect to the word lines 120.

The bit lines 130 are connected to the second SACs 128 through a bit line contact (not shown) passing through a first interlayer dielectric layer 129.

A plurality of buried contacts 160 are formed in a region between adjacent ones of the bit lines 130. The buried contacts 160 are connected to the active region 10 through the first SACs 126 between two adjacent word lines 120.

A plurality of contact barriers 150a are formed between two adjacent first SACs 126 that are, in turn, formed in a region between two adjacent bit lines 130. Accordingly, a contact barrier 150a may be characterized as an insulating line pattern. The contact barriers 150a completely fill a space between adjacent buried contacts 160 formed in a region between adjacent bit lines 130. Thus, the width of a section taken along the x-direction in a longitudinal section of the buried contact 160 is defined by two adjacent contact barriers 150a. The width of a section taken along the y-direction in the longitudinal section of the buried contact 160 is defined by the second insulating spacer 134 covering the bit line 130.

The bit lines 130 are positioned between a plurality of buried contacts 160 arranged in a line along the y-direction. The contact barriers 150a are positioned between a plurality of buried contacts 160 arranged in a line along the x-direction so as to insulate the buried contacts 160 from one another. The contact barriers 150a are formed of a material having an etching selectivity ratio different from the first interlayer dielectric layer 129. For example, in embodiments where the first interlayer dielectric layer 129 include an oxide material, the contact barriers 150a may include a nitride material. In one embodiment, the contact barriers 150a may be formed of a nitride layer. In another embodiment, the second capping layer 132 and the second insulating spacer 134 may include the same (or substantially the same) material as the contact barriers 150a (e.g., a nitride material).

In FIG. 3, the contact barriers 150a can be characterized as a plurality of first insulating lines extending along the y-direction. In FIG. 3, when observed from the top surface of the semiconductor substrate 102, one contact barrier 150a overlaps a single word line 120.

As exemplarily illustrated in FIG. 3, one buried contact 160 is formed in every region defined between two adjacent bit lines 130 and two adjacent word lines 120. It will be appreciated, however, that other embodiments are contemplated. For example, a plurality of buried contacts 160 may be formed in every region defined between two adjacent bit lines 130 and two adjacent word lines 120.

FIGS. 5A through 5G are cross-sectional views taken along line IV-IV' shown in FIG. 3 and sequentially illustrate an exemplary method of manufacturing the semiconductor device shown in FIGS. 3 and 4.

Figure 5A:
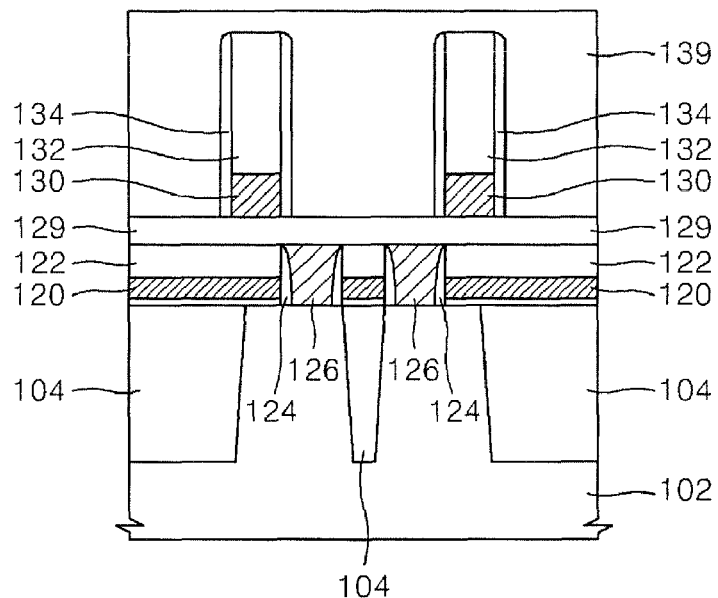
FIGS. 5A through 5G are cross-sectional views taken along line IV-IV' shown in FIG. 3 and sequentially illustrate an exemplary method of manufacturing the semiconductor device shown in FIGS. 3 and 4.

Referring to FIG. 5A, a plurality of word lines 120 extending along a first direction (e.g., the "y"-direction shown in FIG. 3) are formed on a semiconductor substrate 102 having a plurality of active regions 10 defined by an isolation region 104. The top surfaces and sidewalls of the word lines 120 are covered by a first capping layer 122 and a first insulating spacer 124, respectively. The first capping layer 122 and the first insulating spacer 124 may include a material such as a nitride. In one embodiment, the first capping layer 122 and the first insulating spacer 124 may be formed as a nitride layer. Thereafter, first and second SACs 126 and 128, respectively, are formed on the active region 110. As a result, two word lines 120 extend parallel with each other in the y-direction on one active region 110 as shown in FIG. 3 and are self-aligned with respect to the word lines 120 that are covered by the first capping layer 122 and the first insulating spacer 124. The first SACs 126 are formed at both sides of two adjacent word lines 120 and the second SAC 128 is formed between the two adjacent word lines 120.

Thereafter, a first interlayer dielectric layer 129 and a bit line contact (not shown) passing through the first interlayer dielectric layer 129 to be connected to the second SAC 128 are formed on the word lines 120. The first interlayer dielectric layer 129 may include a material such as, for example, an oxide. In one embodiment, the first interlayer dielectric layer 129 is formed of an oxide layer. A plurality of bit lines 130 extending along a second direction (e.g., along the "x"-direction shown in FIG. 3) perpendicular to (or substantially perpendicular to) the first direction are then formed on the first interlayer dielectric layer 129. The bit lines 130 are connected to corresponding ones of the second SACs 128 through the bit line contacts (not shown) passing through the first interlayer dielectric layer 129. The top surfaces and sidewalls of the bit lines 130 are covered by a second capping layer 132 and a second insulating spacer 134, respectively. The second capping layer 132 and the second insulating spacer 134 include a nitride material. In one embodiment, the second capping layer 132 and the second insulating spacer 134 are formed of a nitride layer. A planarized second interlayer dielectric layer 139 is formed to cover the resultant structure having the bit lines 130, which are covered by the second capping layer 132 and the second insulating layer 134. The second interlayer dielectric layer 139 includes an oxide material. In one embodiment, the second interlayer dielectric layer 139 is formed of an oxide layer.

Figure 5B:
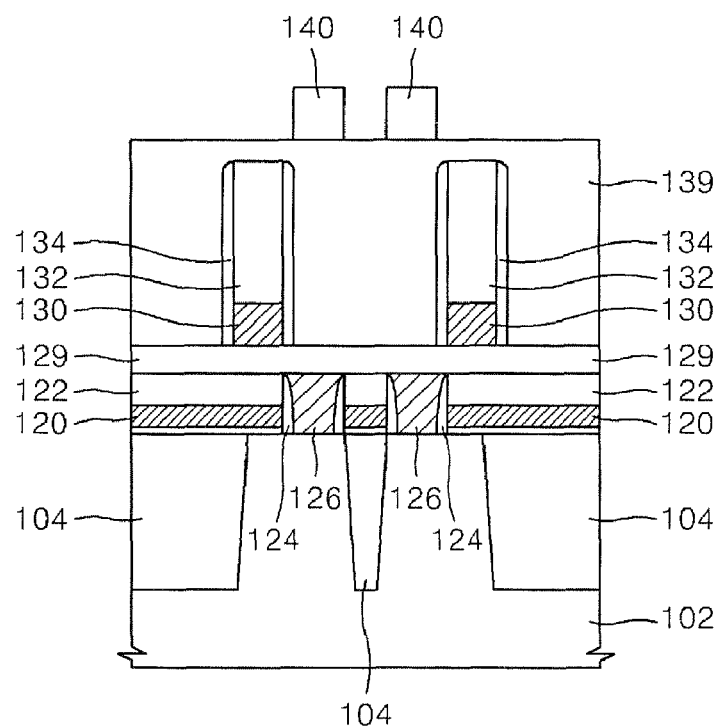

Referring to FIG. 5B, a photoresist pattern 140 having an opening exposing a region corresponding to the position of the word line 120 is formed on a top surface of the second interlayer dielectric layer 139. The photoresist pattern 140 is formed to cover only a region in which a buried contact connected to the first SAC 126 will be subsequently formed.

Figure 5C:
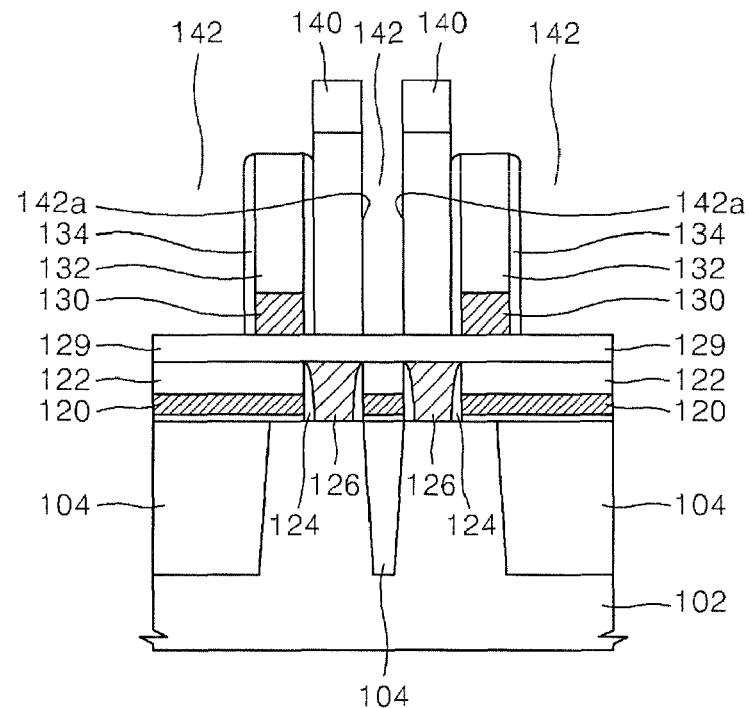

Referring to FIG. 5C, a first space 142 having inner walls 142a exposing the first interlayer dielectric layer 129 is formed by anisotropically dry etching the second interlayer dielectric layer 139 using the photoresist pattern 140 as an etching mask.

In one embodiment, the first space 142 extends parallel with (or substantially parallel with) the word lines 120. As exemplarily shown in FIG. 5C, the first space 142 passes completely through the second interlayer dielectric layer 139. It will be appreciated, however, that that other embodiments are contemplated. For example, only a portion of the total thickness of the second interlayer dielectric layer 139 may be etched to form the first space 142. In another example, a portion of the first interlayer dielectric layer 129 that is exposed after completely passing through the second interlayer dielectric layer 139 may also be etched to form the first space 142. In one embodiment, only a portion of the total thickness of the first interlayer dielectric layer 129 may be etched to form the first space 142. In yet another example, the entire thickness of the first interlayer dielectric layer 129 may be etched to expose the first capping layer 122 covering the word line 120, thereby forming a first space 142 passing completely through the first interlayer dielectric layer 129.

Because the region covered by the photoresist pattern 140 on the second interlayer dielectric layer 139 is a region in which a buried contact connected to the first SAC 126 will be subsequently formed, other regions of the second interlayer dielectric layer 139 are removed to form the first space 142 during the etching process described with reference to FIG. 5C. With regard to the layout illustrated in FIG. 3, the first space 142 is positioned at a region between two adjacent first SACs 126 that are, in turn, formed in a region between two adjacent bit lines 130.

Figure 5D:
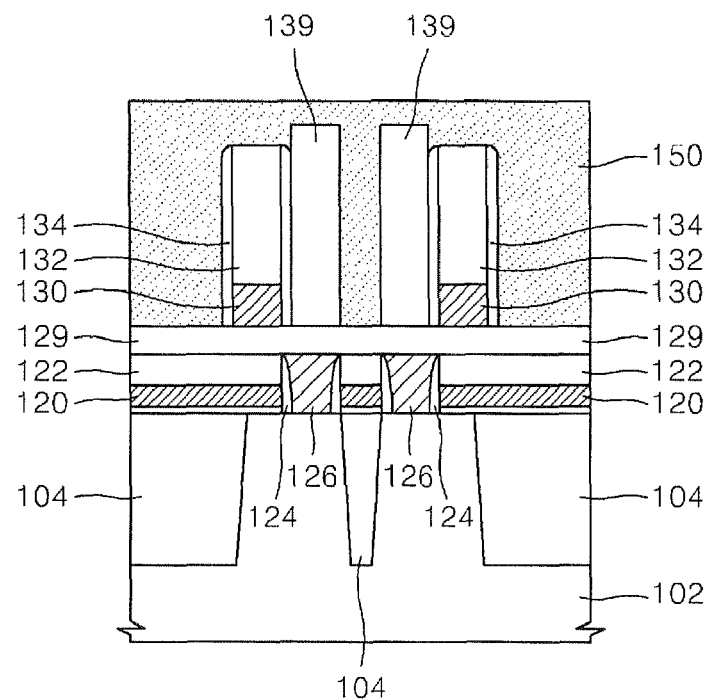

Referring to FIG. 5D, the photoresist pattern 140 is removed. Subsequently, an insulating layer 150 is formed on the second interlayer dielectric layer 139 to completely fill the first space 142. The insulating layer 150 includes a material having an etching selectivity different from the second interlayer dielectric layer 139. In one embodiment, the insulating layer 150 includes a nitride material. In another embodiment, the insulating layer 150 is formed of a nitride layer.

Figure 5E:
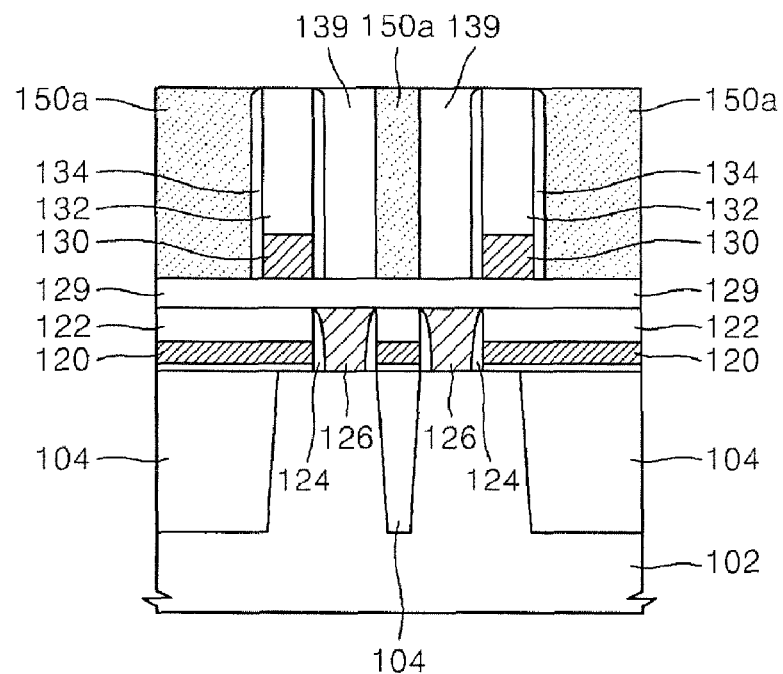

Referring to FIG. 5E, the insulating layer 150 is patterned to expose the second capping layer 132 covering the top surface of the bit line 130 and to expose the second interlayer dielectric layer 139. The insulating layer 150 may be patterned by performing an etchback process upon the insulating layer 150, by performing a chemical mechanical polishing (CMP) process with respect to the resultant structure having the insulating layer 150, or the like or a combination thereof. As a result of patterning the insulating layer 150, a plurality of contact barriers 150a are formed in the first space 142. As illustrated in FIG. 3, a contact barrier 150a is formed between two adjacent first SACs 126 in a region between two adjacent bit lines 130. The contact barrier 150a can be characterized as an insulating line pattern extending along the same direction (or substantially the same direction) as the direction along which the word lines 120 extend. The contact barrier 150a allows two contacts that are formed at both sides of the contact barrier 150 (e.g., subsequently formed buried contacts 160 connected to the first SACs 126) to be insulated from each other.

Subsequently, the first SACs 126 are exposed by removing the second interlayer dielectric layer 139 exposed between the second capping layer 132 and the first contact barrier 150a, and by removing the first interlayer dielectric layer 129 beneath the second interlayer dielectric layer 139. To this end, processes such as those exemplarily described with reference to FIGS. 5F and 5G may be performed.

Figure 5F:
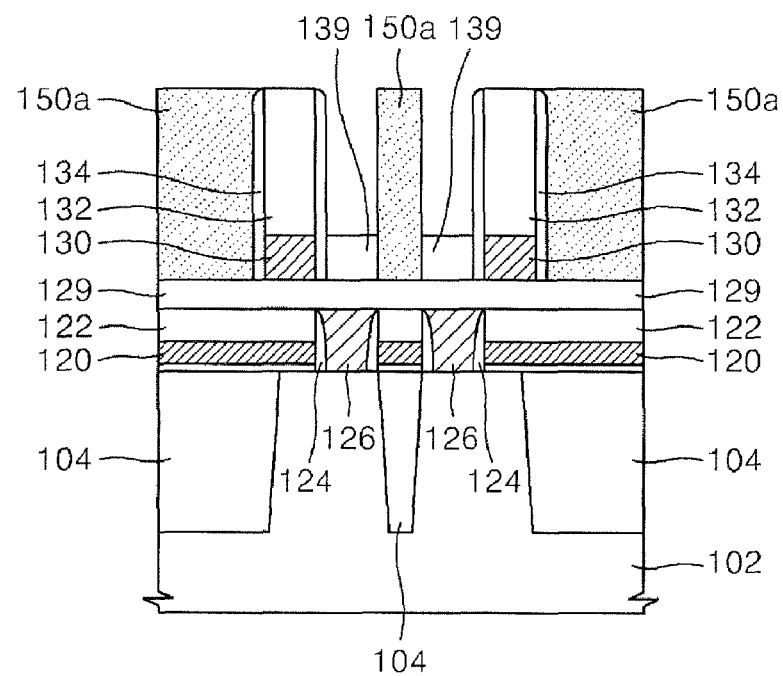

Referring to FIG. 5F, a predetermined portion of the sidewall of the contact barrier 150a is first exposed by removing at least a portion of the second interlayer dielectric layer 139 that is exposed between the capping layer 132, the second insulating spacer 134 and the contact barrier 150a. In one embodiment, the second interlayer dielectric layer 139 may be at least partially removed using a wet etching process in which the capping layer 132, second insulating spacer 134 and the contact barrier 150a function as an etching mask. In FIG. 5F, the wet etching process is performed such that the top surface of the portion of the second interlayer dielectric layer 139 remaining after wet etching the second interlayer dielectric layer 139 is approximately coplanar with a top surface of the bit line 130. It will be appreciated, however, that other embodiments are contemplated. For example, the second interlayer dielectric layer 139 may be completely removed using the aforementioned wet etching process. In such an embodiment, a portion of the first interlayer dielectric layer 129 may be removed after completely removing the second interlayer dielectric layer 139 using the wet etching process. In another embodiment, only a wet etching process is used to remove the first wet etching process until the top surface of the first SAC 126 is exposed. A specific example of such an embodiment will be described in greater detail below.

Figure 5G:
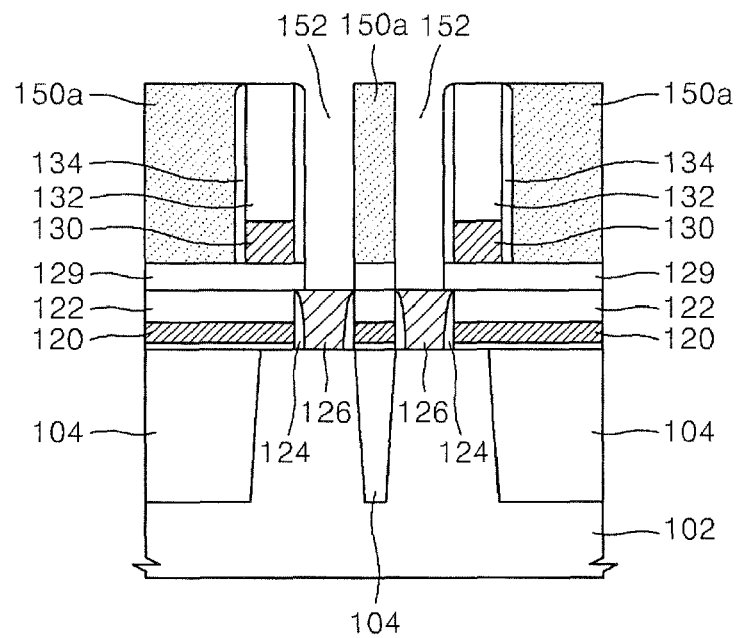

In the embodiment illustrated in FIG. 5G, however, a buried contact hole 152 exposing the top surface of the first SAC 126 is formed by removing the first and second interlayer dielectric layers 129 and 139 remaining on the first SAC 126 using an anisotropic dry etching process in which the second capping layer 132 and second insulating spacer 134 covering the bit line 130 and the contact barrier 150a function an etching mask.

Because at least a portion of the second interlayer dielectric layer 139 was previously removed through a wet etching process, and because a dry etching process for forming the buried contact hole 152 is performed as described with reference to FIG. 5F, the total thickness of first and second interlayer dielectric layers 129 and 139 to be removed through the dry etching process is greatly reduced. Thus, the initial thickness and initial section profile of the second capping layer 132 and second insulating spacer 134 covering the bit line 130 can remain substantially unchanged even after forming the buried contact hole 152.

Thereafter, a buried contact 160 connected to the first SAC 126 is formed, yielding the structure exemplarily illustrated in FIG. 4. In one embodiment, the buried contact 160 is formed by completely filling the buried contact hole 152 with a conductive material (e.g., doped poly-silicon) and covering the second capping layer 132 and the contact barrier 150a with the conductive material. Next, the conductive material may be patterned (e.g., using an etchback process, a CMP process, or the like or a combination thereof) such that the second capping layer 132 and the contact barrier 150a are exposed.

Because the initial thickness and initial section profile of the second capping layer 132 and second insulating spacer 134 covering the bit line 130 remain substantially unchanged, a sufficient margin for insulation between the bit line 130 and the buried contact 160 can be ensured.

FIGS. 6A through 6G are cross-sectional views taken along lines IV-IV' and VI-VI' shown in FIG. 3 and sequentially illustrate another exemplary method of manufacturing the semiconductor device shown in FIGS. 3 and 4.

In the method exemplarily described with respect to FIGS. 5A through 5G, a two-step etching process, involving a first wet etch process and second dry etching process, is used to form the buried contact hole 152 (see FIG. 5G). According to the method exemplarily described with respect to FIGS. 6A through 6G, however only a wet etching process is used to form the buried contact hole 152. In the embodiment shown in FIGS. 6A through 6G, like numbers with respect to the embodiment illustrated in FIGS. 5A through 5G refer to like elements.

In the exemplary method described with reference to FIGS. 5A through 5G, the second insulating spacer 134 is formed to cover the sidewall of the bit line 130 and a top surface of the first interlayer dielectric layer 129. As a result, the distance from the top surface of the semiconductor substrate 102 to the bottom surface of the second insulating spacer 134 is greater than the distance from the top surface of the semiconductor substrate 102 to the top surface of the first SAC 126. In the exemplary method described with reference to FIGS. 6A through 6G, however, the second insulating spacer 134 is formed to cover the sidewall of the bit line 130 and extend below the top surface of the first interlayer dielectric layer 129. In another embodiment, the second insulating spacer 134 may be formed to extend to the top surface of the first interlayer dielectric layer 129. By forming the second insulating spacer 134 to extend to or below the top surface of the first interlayer dielectric layer 129, the first interlayer dielectric layer 129 can be prevented from being undesirably damaged during a wet etching process used to form the buried contact hole 152. This will be described in greater detail below.

Figure 6A:
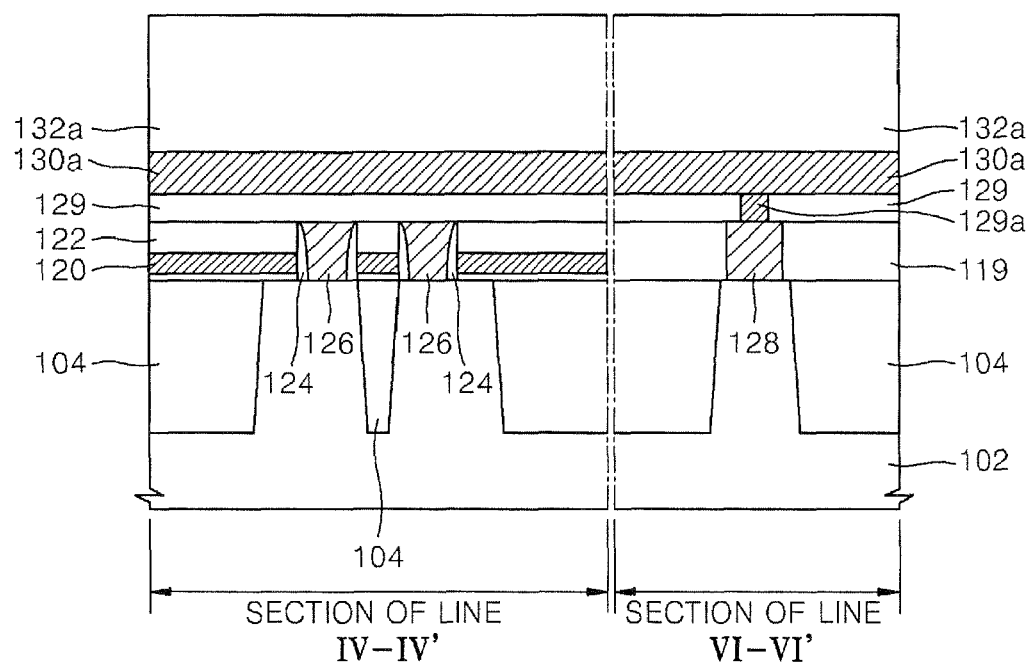

Referring to FIG. 6A, a first interlayer dielectric layer 129 may be formed on a semiconductor substrate 102 using the same method described with reference to FIG. 5A. In FIG. 6A, a second SAC 128 passes through a lower interlayer dielectric layer 119 and a bit line contact 129a passes through the first interlayer dielectric layer 129, both along the section of line VI-VI'. Thereafter, a conductive layer 130a for forming bit lines and an insulating layer 132a for forming second capping layers are formed on the first interlayer dielectric layer 129.

Figure 6B:
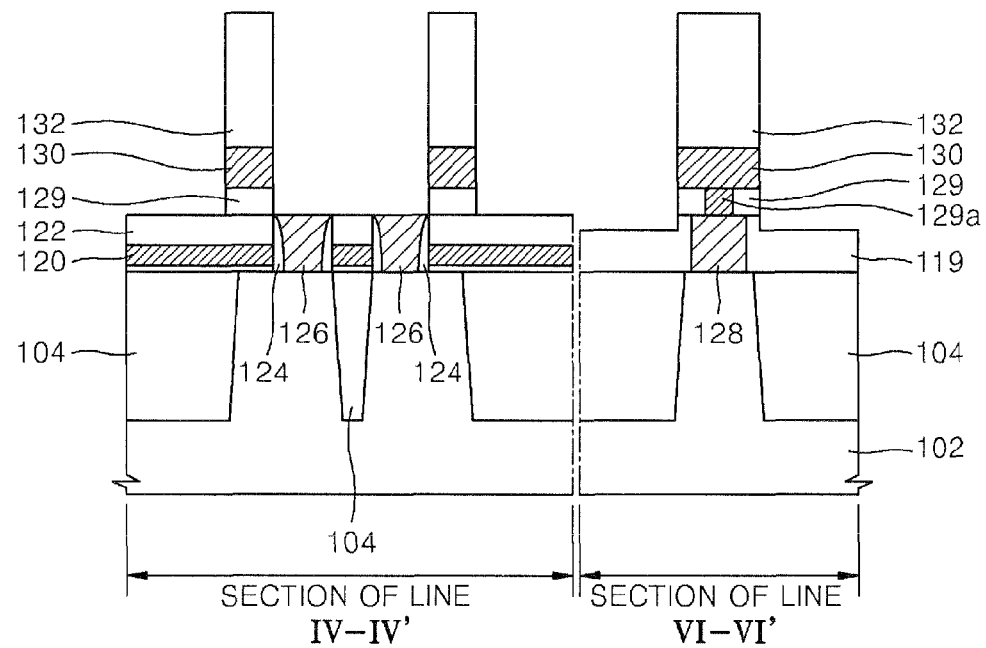

Referring to FIG. 6B, a bit line 130 having a top surface covered by a second capping layer 132 is formed by patterning the conductive layer 130a for forming bit lines and the insulating layer 132a for forming second capping layers. As exemplarily shown in FIG. 6B, the first interlayer dielectric layer 129 and the lower interlayer dielectric layer 119 are also patterned during the etching process used to pattern the conductive layer 130a. In FIG. 6B, the etching process is performed down to the first interlayer dielectric layer 129 in the section of line IV-IV', and the etching process is performed down to the first interlayer dielectric layer 129 and the lower interlayer dielectric layer 119 in the section of line VI-VI'. This is because the first capping layer 122 covering the word line 120 includes a nitride material and each of the lower, first and second interlayer dielectric layers 119, 129 and 139 include an oxide material. In one embodiment, the first capping layer 122 is formed of a nitride layer and each of the lower, first and second interlayer dielectric layers 119, 129 and 139 are formed of an oxide layer.

Figure 6C:
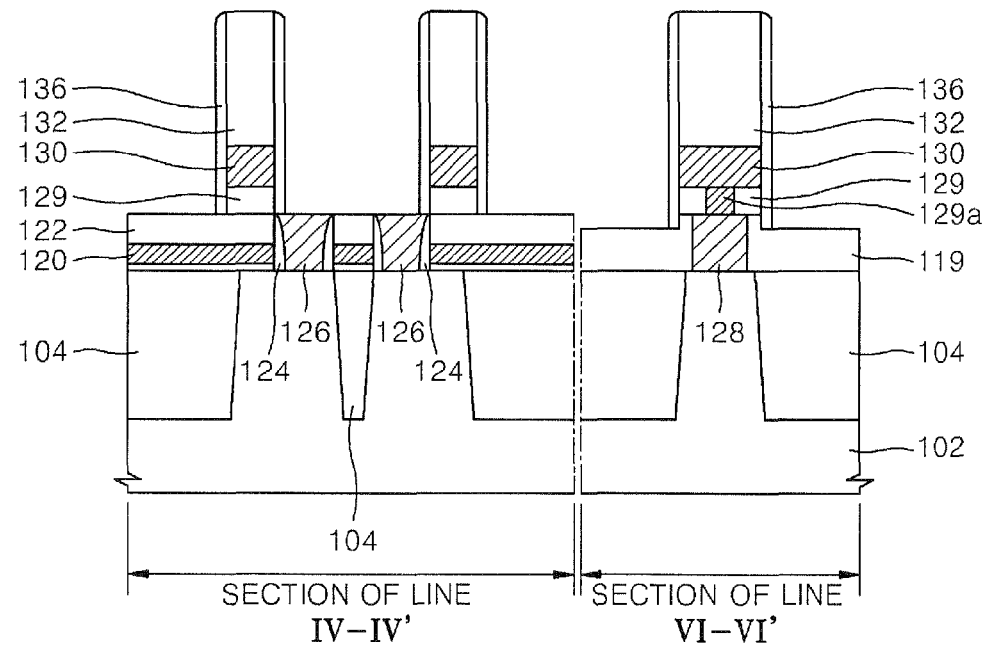

Referring to FIG. 6C, a second insulating spacer 136 is formed on the sidewalls of the bit line 130 and the second capping layer 132 by depositing a nitride material on the entire surface of the resultant structure shown in FIG. 6B and then performing an etchback process with respect to the nitride material. The second insulating spacer 136 covers not only the sidewalls of the bit line 130 and the second capping layer 132 but also covers the sidewalls of the lower and first interlayer dielectric layers 119 and 129. Thus, in FIG. 6B, the second insulating spacer 136 extends to the top surface of the first SAC 126 in the section of line IV-IV' and the second insulating spacer 136 extends to the level lower than the top surface of the second SAC 128 in the section of line VI-VI'.

In the embodiment exemplarily illustrated with reference to FIGS. 5A through 5G, the distance from the top surface of the semiconductor substrate 102 to the bottom surface of the second insulating spacer 134 is greater than the distance from the top surface of the semiconductor substrate 102 to the top surface of the first and second SACs 126 and 128. On the other hand, in the embodiment exemplarily illustrated with reference to FIGS. 6A through 6G, the distance from the top surface of the semiconductor substrate 102 to the bottom surface of the second insulating spacer 136 is less than the distance from the top surface of the semiconductor substrate 102 to the top surface of the first and second SACs 126 and 128.

Figure 6D:
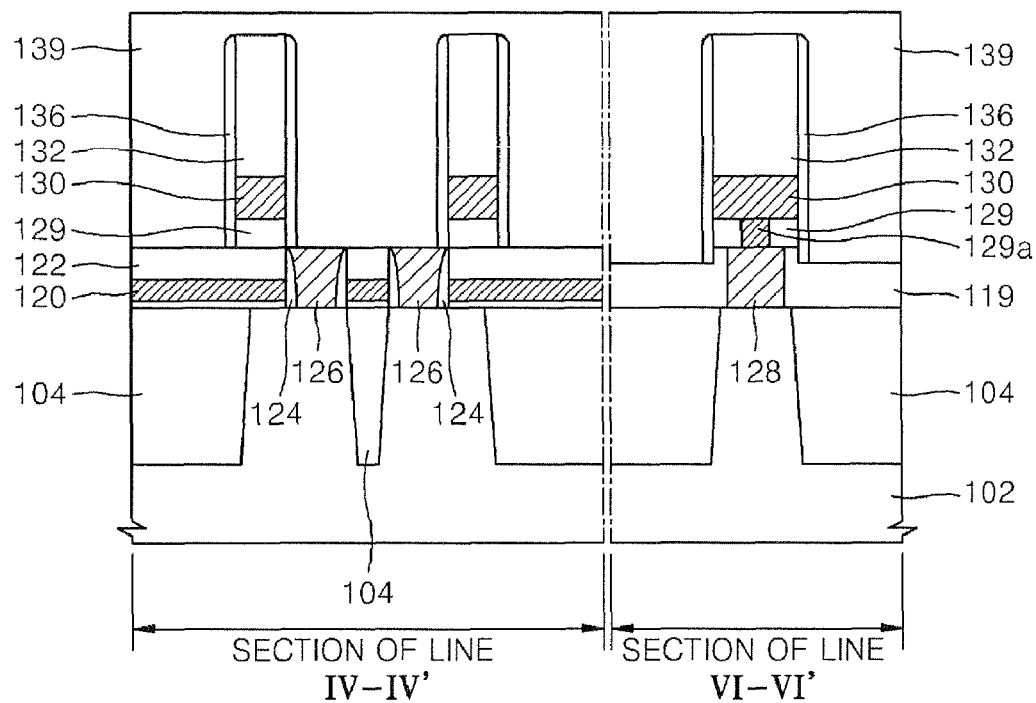

Referring to FIG. 6D, a planarized second interlayer dielectric layer 139 is formed on the resultant structure of FIG. 6C.

Figure 6E:
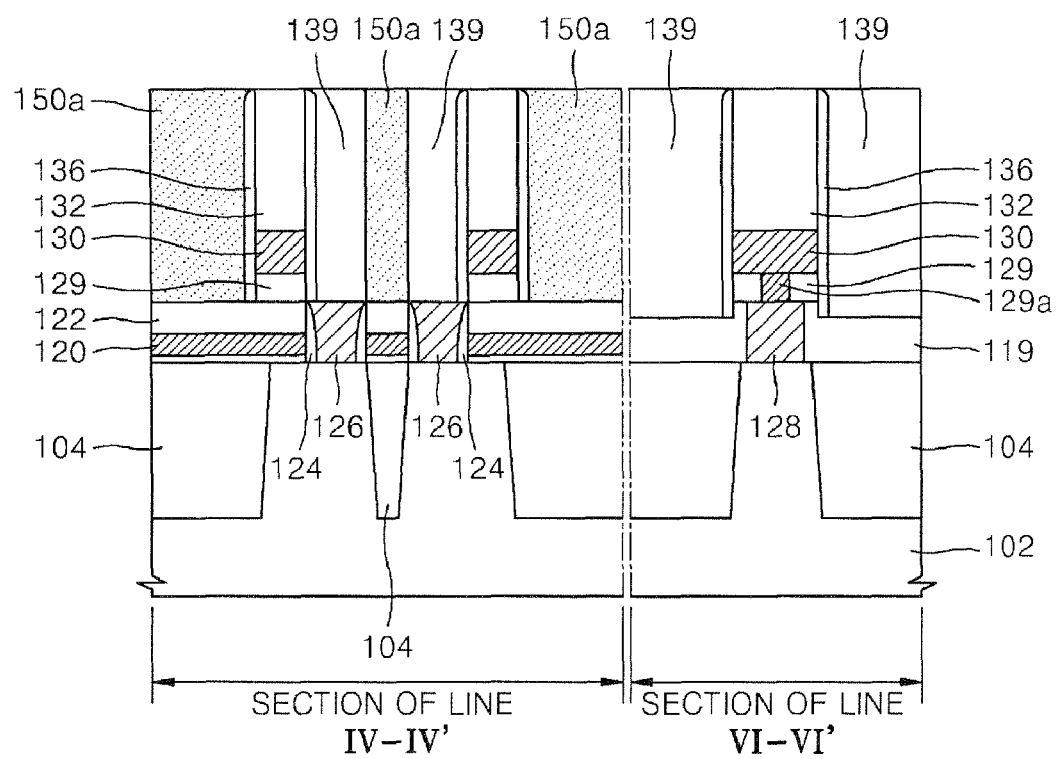

Referring to FIG. 6E, the second interlayer dielectric layer 139 may be patterned and the contact barrier 150a may be formed using the same method described above with reference to FIGS. 5B through 5E.

Referring to FIG. 6F, a buried contact hole 154 is formed by removing the second interlayer dielectric layer 139 exposed between the second capping layer 132 and second insulating spacer 136 covering the bit line 130 and the contact barrier 150a through a wet etching process in which the second capping layer 132, second insulating spacer 136 and the contact barrier 150a function as an etching mask until the top surface of the first SAC 126 is exposed.

In the section of line VI-VI', the buried contact hole 154 is deeper than the buried contact hole 152 formed in FIG. 5G. Because the second insulating spacer 136 extends around the second SAC 128 to a level lower than the top surface of the second SAC 128, the second insulating spacer 136 can effectively prevent the first interlayer dielectric layer 129, filled between the second SAC 128, the bit line contact 129a and the bit line 130, from being damaged by an etchant in the wet etching process for removing the second interlayer dielectric layer 139. Because the etching process used to form the buried contact hole 154 in the second dielectric layer 139 is performed using only a wet etching process, the initial thickness and initial section profile of the second capping layer 132 and second insulating spacer 134 covering the bit line 130 can remain substantially unchanged even after forming the buried contact hole 154.

Referring to FIG. 6G, a buried contact 160 connected to the first SAC 126 may be formed to fill the buried contact hole 154 using the same method described with reference to FIGS. 4 and 5G. Because the initial thickness and initial section profile of the second capping layer 132 and second insulating spacer 134 covering the bit line 130 remain substantially unchanged, a sufficient margin for insulation between the bit line 130 and the buried contact 160 can be ensured.

Figure 7:
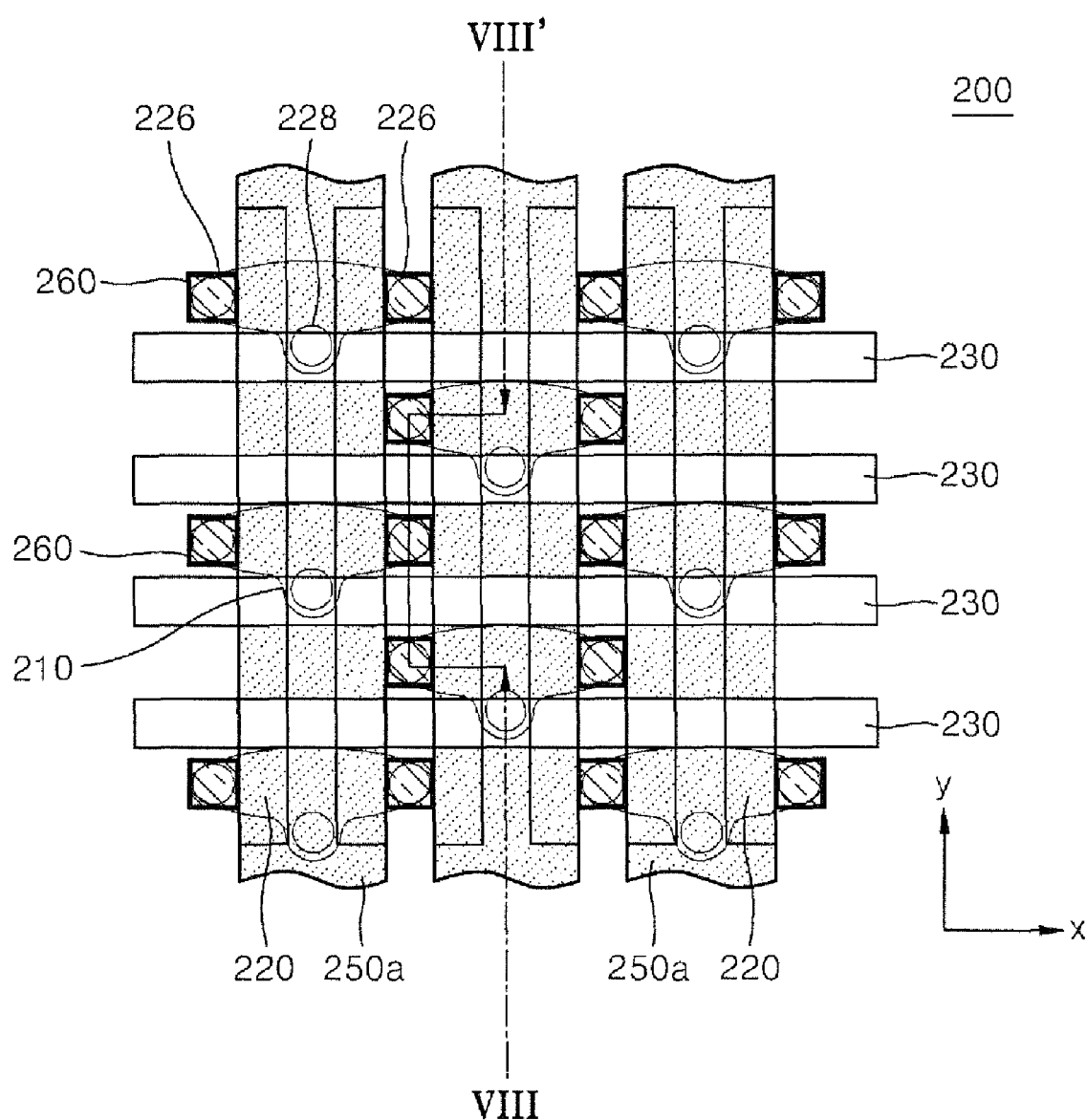
FIG. 7 is a schematic view of a semiconductor device according to another embodiment.
Figure 8:
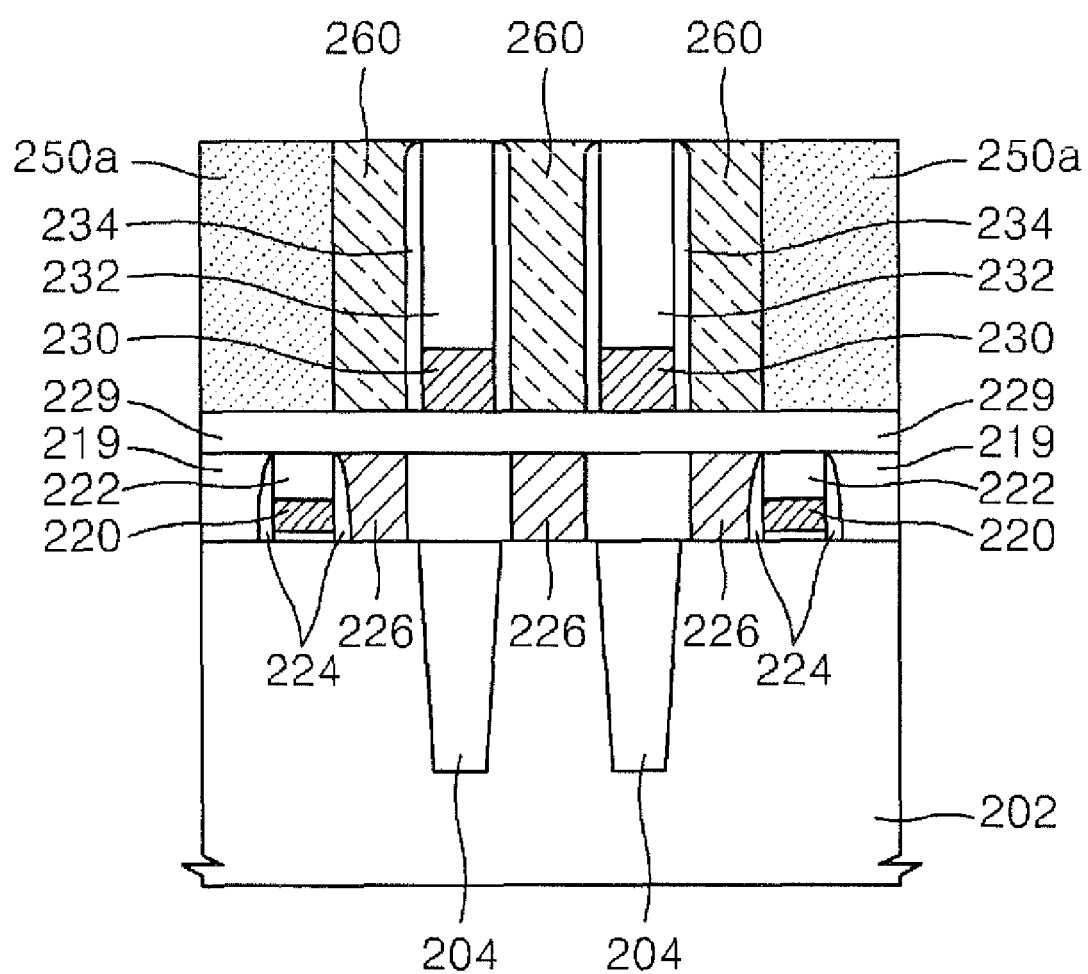
FIG. 8 is a cross-sectional view taken along line VIII-VIII' shown in FIG. 7.

FIG. 7 is a schematic view of a semiconductor device according to another embodiment. It will be appreciated that the semiconductor device schematically illustrated in FIG. 7 may be applied to a memory cell having, for example, a unit cell size of $8F^2$. FIG. 8 is a cross-sectional view taken along line VIII-VIII' shown in FIG. 7.

Referring to FIGS. 7 and 8, a semiconductor device 200 according to another embodiment may, for example, be similar to the semiconductor device 100 exemplarily described with respect to FIG. 3 in that contact barriers 250a forming a plurality of insulating lines extend along the same direction (or substantially the same direction) as the extension direction of a plurality of word lines 220. In the semiconductor device 200 described with respect to FIGS. 7 and 8, however, each of the contact barriers 250a can be characterized as overlapping two adjacent word lines 220 when viewing the semiconductor device 200 from the top surface of a semiconductor substrate 202. For example, one contact barrier 250a may overlap two word lines 220 formed over a single active region 210.

The semiconductor device 200 may, for example, include a plurality of word lines 220 extending along a first direction (e.g., the "y"-direction) over a semiconductor substrate 202 having a plurality of active regions 210 defined by an isolation region 204. A plurality of bit lines 230 extend along a second direction (e.g., the "x"-direction) that is perpendicular (or substantially perpendicular) to the first direction. The top surfaces and sidewalls of the word lines 220 are covered by a first capping layer 222 and a first insulating spacer 224, respectively. The top surfaces and sidewalls of the bit lines 230 are covered by a second capping layer 232 and a second insulating spacer 234, respectively. Each of the first capping layer 122, the first insulating spacer 124, the second capping layer 132 and the second insulating spacer 134 may include a material such as, for example, a nitride. In one embodiment, each of the first capping layer 122, the first insulating spacer 124, the second capping layer 132 and the second insulating spacer 134 may be formed as a nitride layer.

The connection relationship between first and second SACs 226 and 228 formed on the plurality of active regions 210 and the bit lines 230 connected to the active regions 210 of the semiconductor substrate 202 through the first and second SACs 226 and 228 is similar to the configuration illustrated in FIG. 3. Accordingly, a detailed description of such structures is omitted for the sake of brevity.

A plurality of contact barriers 250a are formed between two adjacent first SACs 226 that are, in turn, formed in a region between two adjacent bit lines 230. Accordingly, the plurality of contact barriers 250a may be characterized as a plurality of insulating line patterns. The contact barriers 250a completely fill a space between adjacent buried contacts 260 formed in a region between adjacent bit lines 230. Thus, the width of a section taken along the x-direction in a longitudinal section of the buried contact 260 is defined by two adjacent contact barriers 250a. The width of a section taken along the y-direction in the longitudinal section of the buried contact 260 is defined by the second insulating spacer 234 covering the bit lines 230.

The bit lines 230 are positioned between a plurality of buried contacts 260 arranged in a line along the y-direction. The contact barriers 250a are positioned between a plurality of buried contacts 260 arranged in a line along the x-direction so as to insulate the buried contacts 260 from one another. As exemplarily illustrated in FIG. 7, no buried contact 260 is formed at portions covered by the contact barriers 250a in a region defined by two adjacent bit lines 230 and two adjacent word lines 220. However, one buried contact 260 is formed at a portion which is not covered by the contact barriers 250a in the region defined by two adjacent bit lines 230 and two adjacent word lines 220. The contact barriers 250a may be similar to the contact barriers 150a described with reference to FIGS. 3, 4 and 5A through 5G. However, in the embodiment exemplarily illustrated in FIGS. 7 and 8, one contact barrier 250a overlaps with two adjacent word lines 220 when viewing the semiconductor device 200 from the top surface of the substrate 202.

The semiconductor device 200 illustrated in FIGS. 7 and 8 can, in one embodiment, be obtained using processes similar to the processes of FIGS. 5A through 5G or processes of FIGS. 6A through 6G. Because a portion of, or an entirety of, an interlayer dielectric layer (not shown) between the bit lines 230 is removed using a wet etching process in which the second capping layer 232, the second insulating spacer 234 and the contact barriers 250a function an etching mask to form the buried contacts 260 will be formed, the initial thickness and initial section profile of the second capping layer 232 and second insulating spacer 234 covering the bit lines 230 remain substantially unchanged. Accordingly, a sufficient margin for insulation between the bit line 230 and the buried contacts 260 can be ensured.

Figure 9:
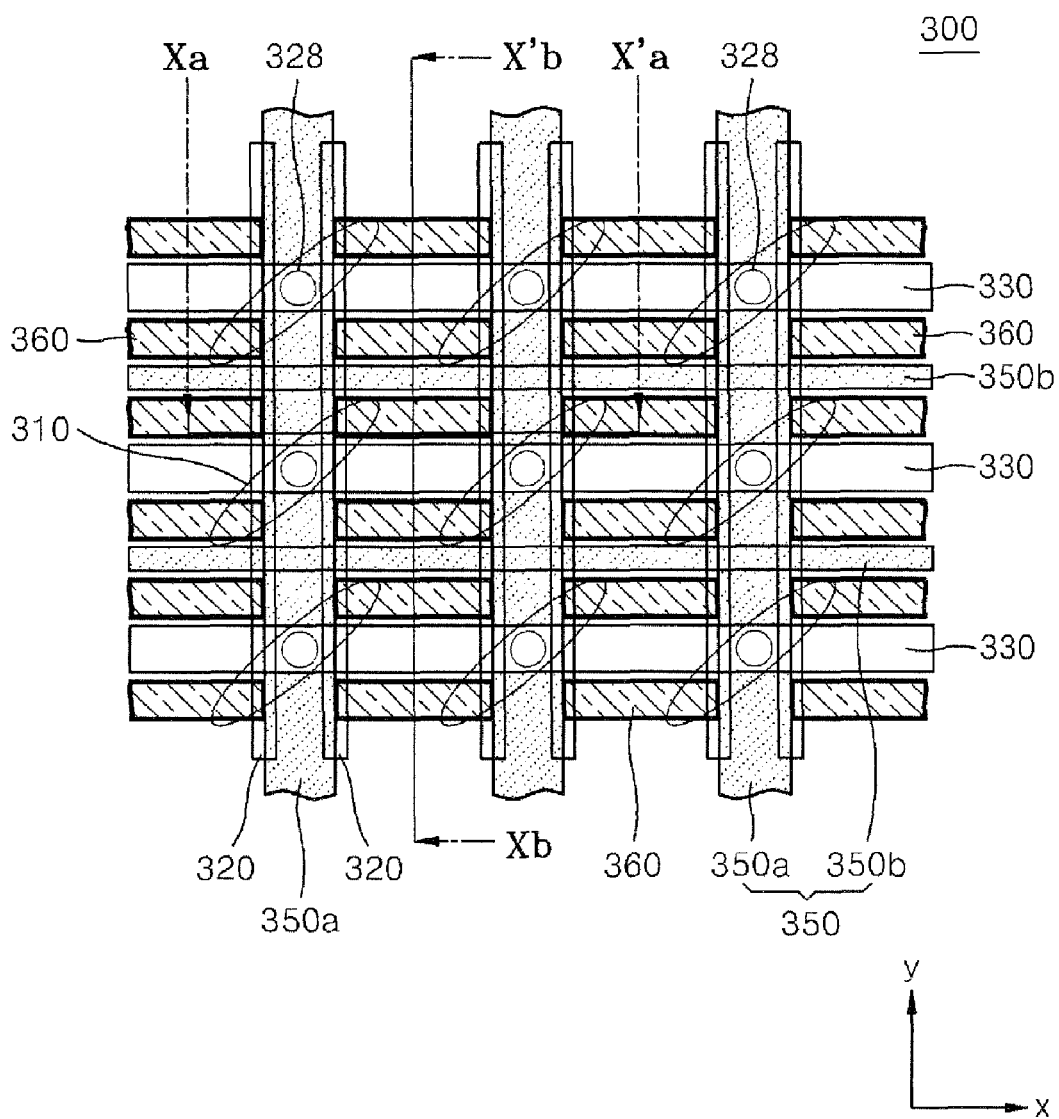
FIG. 9 is a schematic view of a semiconductor device according to yet another embodiment.
Figure 10:
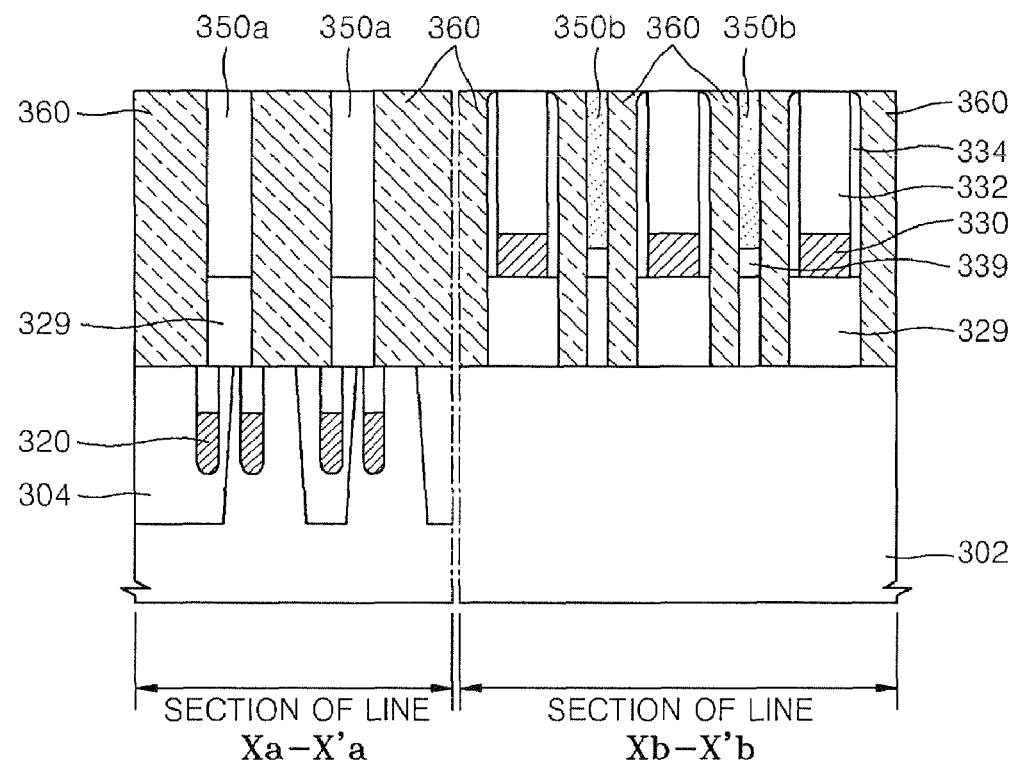
FIG. 10 is a cross-sectional view taken along lines Xa-X'a and Xb-X'b shown in FIG. 9.

FIG. 9 is a schematic view of a semiconductor device according to yet another embodiment. It will be appreciated that the semiconductor device schematically illustrated in FIG. 7 may be applied to a memory cell having, for example, a unit cell size of $4F^2$. FIG. 10 is a cross-sectional view of the semiconductor device taken along lines Xa-X'a and Xb-X'b shown in FIG. 9.

Referring to FIGS. 9 and 10, a semiconductor device 300 according to yet another embodiment may, for example, include a contact barrier 350 that includes a plurality of first insulating lines 350a extending along the same direction as the direction along which a plurality of word lines 320 extend and a plurality of second insulating lines 350b extending along a direction perpendicular (or substantially perpendicular) to the direction along which the first insulating lines 350a extend. Each of the plurality of second insulating lines 350b may be located in a region between two adjacent bit lines 330 and extend along the same direction as the direction along which a plurality of bit lines 330 extend. Thus, the first and second insulating lines 350a and 350b may intersect each other at predetermined positions over a semiconductor substrate 302.

Similar to the contact barriers 250a of the semiconductor device 200 exemplarily described with reference to FIGS. 7 and 8, each the first insulating lines 350a of the contact barrier 350 may overlap with two adjacent word lines 320 when viewed from the top surface of the semiconductor substrate 302. For example, one first insulating line 350a may overlap with two word lines 320 formed together on a single active region 310.

The semiconductor device 300 may, for example, include a plurality of word lines 320 extending along a first direction (e.g., the "y"-direction) while being buried within a semiconductor substrate 302 having a plurality of active regions 310 defined by an isolation region 304. A plurality of bit lines 330 extend along a second direction (e.g., the "x"-direction) that is perpendicular (or substantially perpendicular) to the first direction along which the word lines 320 extend. The top surface and sidewalls of the bit lines 330 are covered by a second capping layer 332 and a second insulating spacer 334, respectively. Each of the second capping layer 332 and the second insulating spacer 334 may include a material such as, for example, a nitride. In one embodiment, each of the second capping layer 332 and the second insulating spacer 334 may be made of a nitride layer. The bit lines 330 are connected to the active regions 310 through direct contacts 328 passing through a first interlayer dielectric layer 329.

A plurality of buried contacts 360 are formed in region defined between two adjacent bit lines 330 and two adjacent word lines 320. As exemplarily illustrated in FIG. 9, two buried contacts 360 are formed in every region defined between two adjacent bit lines 330 and two adjacent word lines 320. It will be appreciated, however, that other embodiments are contemplated. For example, three or more buried contacts 360 may be formed in regions defined between two adjacent bit lines 330 and two adjacent word lines 320, in accordance with various layouts.

As shown more clearly in the section view along line Xa-X'a in FIG. 10, the buried contacts 360 are formed in the shape of a direct buried contact and are connected directly to the active region 310 of the semiconductor substrate 302. The width of the buried contacts 360 in the x-direction is defined by the first insulating lines 350a of the contact barriers 350. The width of the buried contacts 360 in the y-direction is defined by the second insulating spacer 334 covering the sidewalls of the bit lines 330 and the second insulating lines 350b of the contact barriers 350. Two buried contacts 360 formed in one region defined between two adjacent bit lines 330 and two adjacent word lines 320 are insulated from each other by the second insulating line 350b formed between the two adjacent buried contacts 360.

The bit lines 330 or the second insulating lines 350b of the contact barrier 350 are positioned between the plurality of buried contacts 360 arranged in a line along the y-direction. The first insulating lines 350a of the contact barriers 350 are positioned between the plurality of buried contacts 360 arranged in a line along the x-direction so as to insulate the buried contacts 360 from one another. The first and second insulating lines 350a and 350b may include the same (or substantially the same) material. In one embodiment, the first and second insulating lines 350a and 350b may be formed of the same (or substantially the same) material as each other.

FIGS. 11A through 11H are cross-sectional views taken along lines Xa-X'a and Xb-X'b shown in FIG. 9 and sequentially illustrate an exemplary method of manufacturing the semiconductor device shown in FIG. 9. It will be appreciated, however, that other embodiments are contemplated and that various modifications and changes can be made thereto.

Figure 11A:
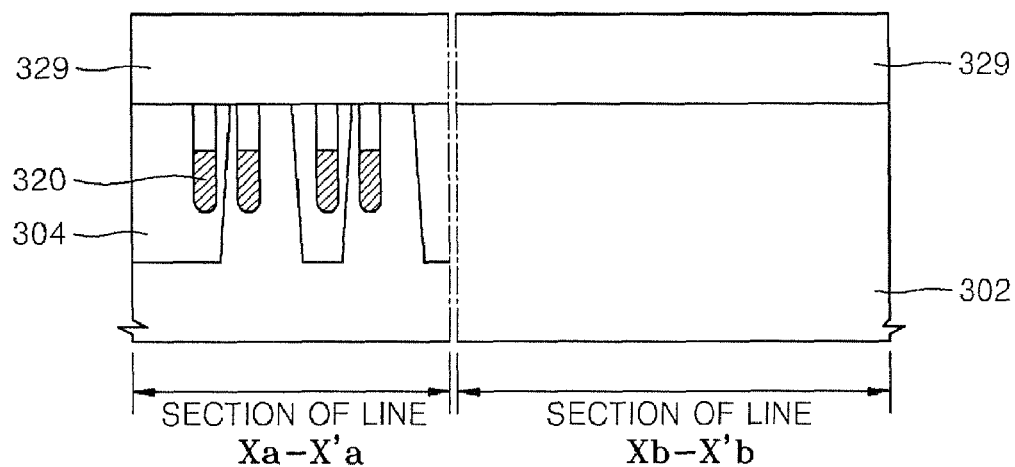
FIGS. 11A through 11H are cross-sectional views taken along lines Xa-X'a and Xb-X'b shown in FIG. 9 and sequentially illustrate an exemplary method of manufacturing the semiconductor device shown in FIG. 9.

Referring to FIG. 11A, a plurality of word lines 320 extending along a first direction (e.g., the y-direction shown in FIG. 9) are formed such that they are buried in a semiconductor substrate 302 having a plurality of active regions 310 defined by an isolation region 304, as illustrated in the layout of FIG. 9. It will be appreciated, however, that other embodiments are contemplated. For example, the word lines 320 may be formed on the top surface of the semiconductor substrate 320 as illustrated in FIGS. 4 and 8. As exemplarily illustrated in FIGS. 9 and 10, two word lines 320 extend parallel with each other along the y-direction on one active region 310.

A first interlayer dielectric layer 329 and direct contacts 328 (see FIG. 9) passing through the first interlayer dielectric layer 329 to be connected to the active regions 310 are formed on the semiconductor substrate 302 having the word lines 320. The first interlayer dielectric layer 329 may include an oxide. In one embodiment, the first interlayer dielectric layer 329 is formed of an oxide layer.

Figure 11B:
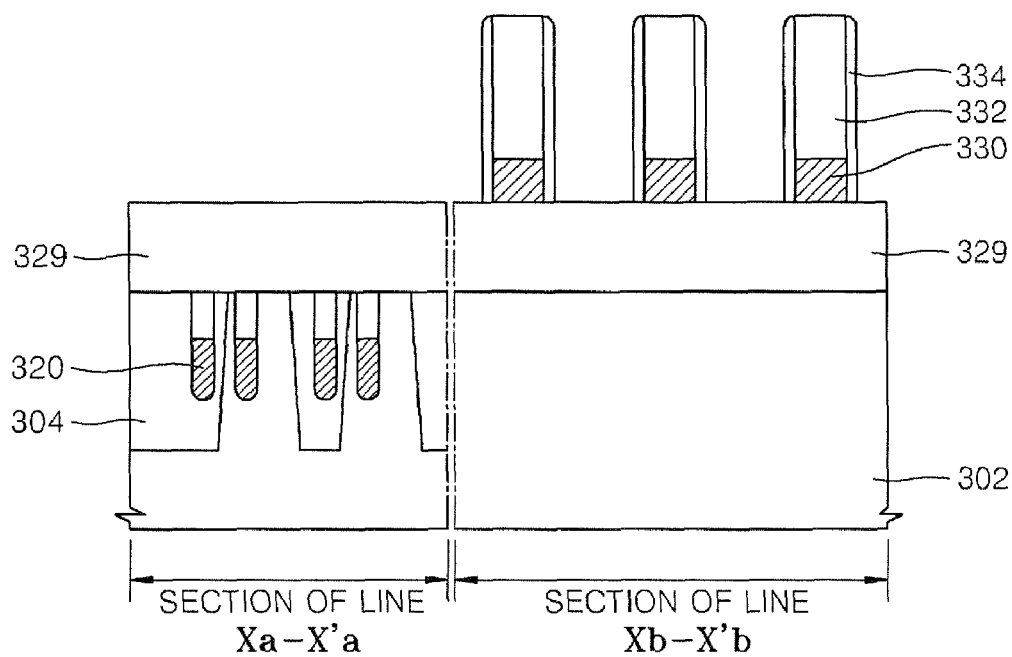

Referring to FIG. 11B, a plurality of bit lines 330 are connected to the direct contacts 328. The top surface and sidewalls of the bit lines 330 are covered by a second capping layer 322 and a second insulating spacer 324, respectively. Each of the second capping layer 322 and the second insulating spacer 324 may include a material such as, for example, a nitride. In one embodiment, each of the second capping layer 322 and the second insulating spacer 324 may be formed as a nitride layer.

Figure 11C:
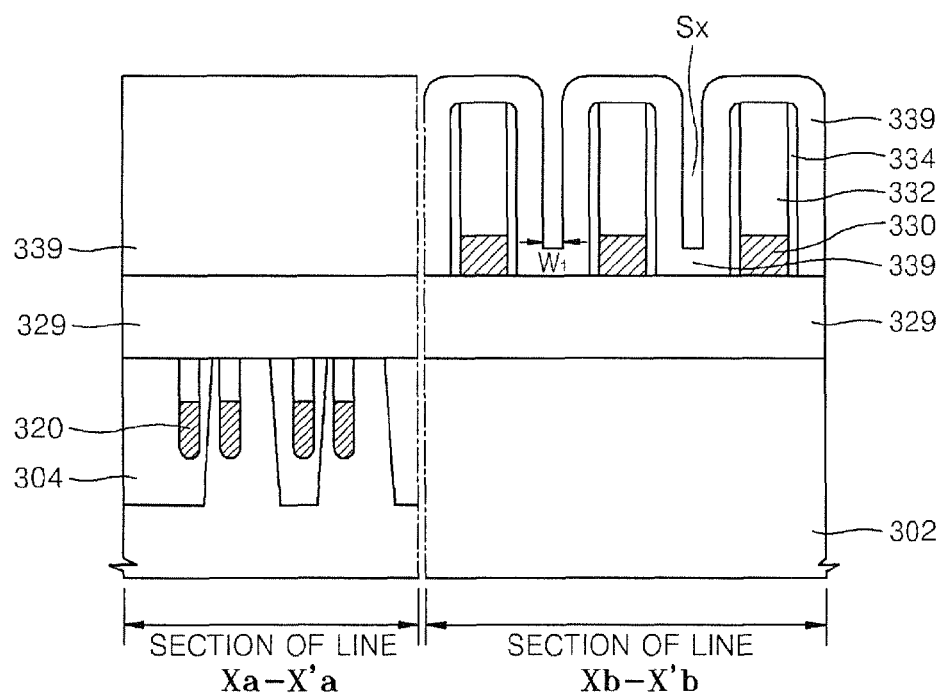

Referring to FIG. 11C, a second interlayer dielectric layer 339 covering the second capping layer 322, the second insulating spacer 324 and the first interlayer dielectric layer 329 may be formed to a predetermined thickness over the entire surface of the semiconductor substrate 302 having the bit lines 330. A plurality of recesses are formed in the top surface of the second interlayer dielectric layer 339. In one embodiment, each of the recesses may have a predetermined width W1 between two bit lines 330 adjacent to each other in the plurality of bit lines 330 and define a space Sx extending along a direction (e.g., the x-direction shown in FIG. 9) parallel with the bit lines 330. The second interlayer dielectric layer 339 may, for example, include an oxide material. In one embodiment, the second interlayer dielectric layer 339 may be made of an oxide layer formed using an atomic layer deposition (ALD) process.

Figure 11D:
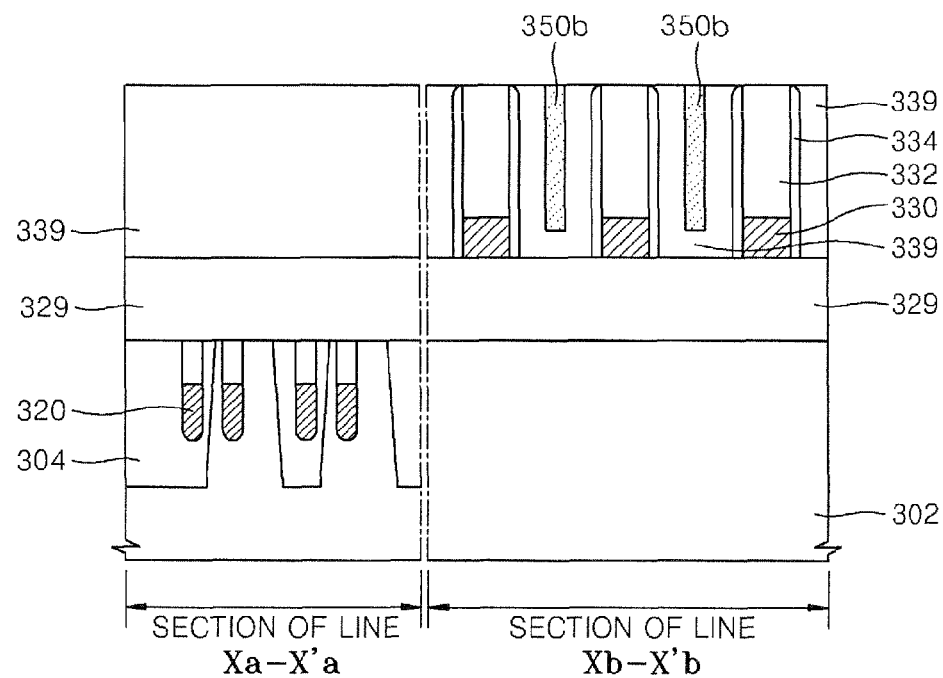

Referring to FIG. 11D, an insulating layer is deposited on the semiconductor substrate 302 having the second interlayer dielectric layer 339 so as to completely fill the spaces Sx. In one embodiment, the insulating layer may include a material having an etching selectivity different from that of the second interlayer dielectric layer 339. For example, the insulating layer may include a nitride material. Thereafter, the insulating layer is patterned (e.g., performing an etchback process, a CMP process, or the like or a combination thereof) until the top surface of the second interlayer dielectric layer 339 or the second capping layer 332 is exposed, thereby forming the second insulating lines 350b of the contact barriers 350 in the spaces Sx.

Figure 11E:
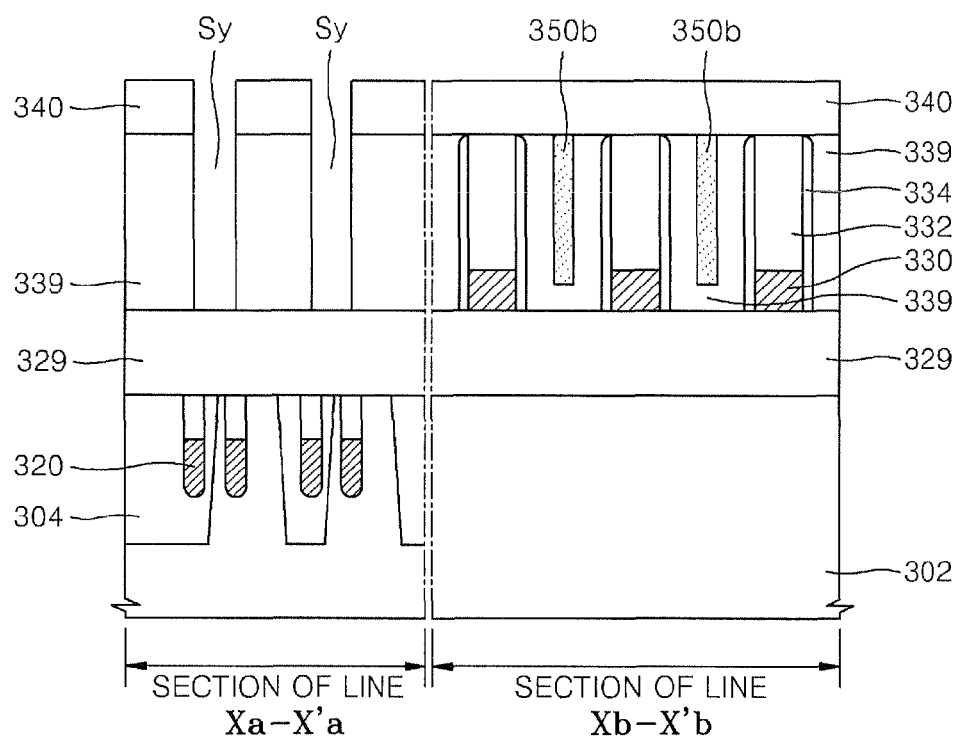

Referring to FIG. 11E, a photoresist pattern 340 is formed on the semiconductor substrate having the second insulating lines 350b formed thereon. The photoresist pattern 340 has openings that each expose regions corresponding to the positions of two word lines 220 formed together at a single active region.

Thereafter, spaces Sy are formed within the second interlayer dielectric layer 339 by anisotropically dry etching portions of the second interlayer dielectric layer 339 and the second insulating lines 350b using the photoresist pattern 340 as an etching mask. When viewed from the top surface of the semiconductor substrate 302, the shape of the spaces Sy may correspond to the shape of the first insulating lines 350a shown in FIG. 9. As exemplarily illustrated in FIG. 9, the second interlayer dielectric layer 339 and the second insulating lines 350b are simultaneously exposed to sidewalls of the spaces Sy. The spaces Sy extend in a direction (e.g., the y-direction shown in FIG. 9) parallel with the word lines 320.

Although the spaces Sy pass through the second interlayer dielectric layer 339 in FIG. 11E, it will be appreciated that other embodiments are contemplated. In one embodiment, the bottom surface of the spaces Sy may be coplanar (or substantially coplanar) with the bottom surfaces of the bit lines 330, depending on an etching depth in the dry etching process used to form the spaces Sy. In another embodiment, the bottom surface of the spaces Sy may be higher or lower than the bottom surfaces of the bit lines 330.

Figure 11F:
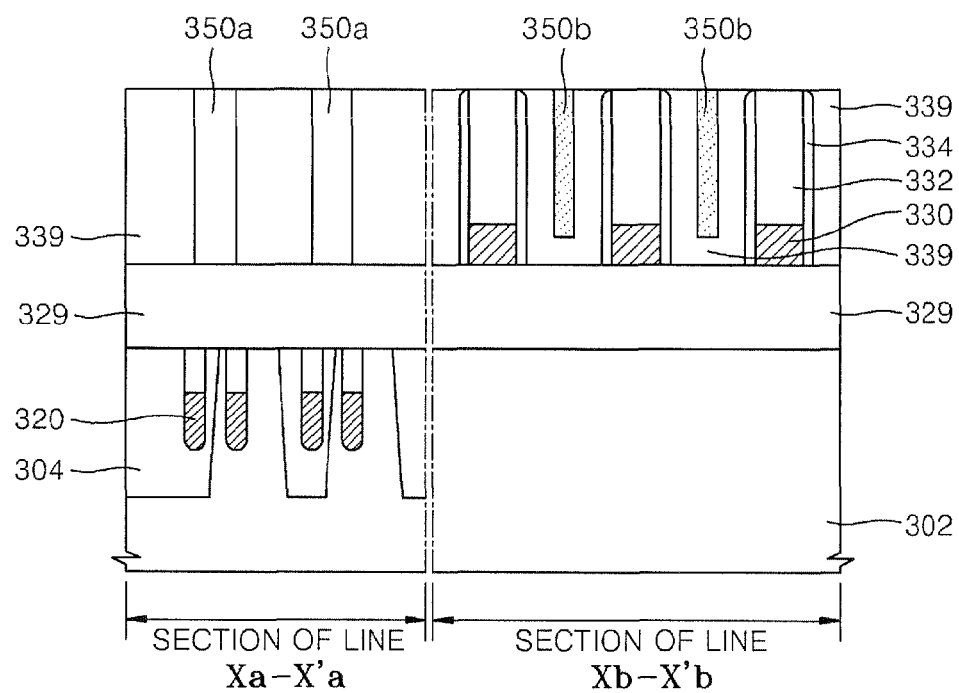

Referring to FIG. 11F, the photoresist pattern 340 is removed. Subsequently, an insulating layer is formed on the second interlayer dielectric layer 339 to completely fill the spaces Sy. The insulating layer may include a material having an etching selectivity different from the second interlayer dielectric layer 339. In one embodiment, the insulating layer includes a nitride material. In another embodiment, the insulating layer is formed of a nitride layer. Next, the insulating layer is patterned (e.g., by performing an etchback process, a CMP process, or the like or a combination thereof) to form the first insulating lines 350a of the contact barriers 350 in the spaces Sy. When the insulating layer is patterned using a CMP process, the CMP process is performed until the second interlayer dielectric layer 339 and the capping layer 332 are exposed. In one embodiment, the first insulating lines 350a are formed of the same (or substantially the same) material as the second insulating lines 350b. In another embodiment, however, the first insulating lines 350a and second insulating lines 350b may be formed from different materials. In one embodiment, the first and second insulating lines 350a and 350b may each include a material having an etching selectivity different from the first and second interlayer dielectric layers 329 and 339.

Figure 11G:
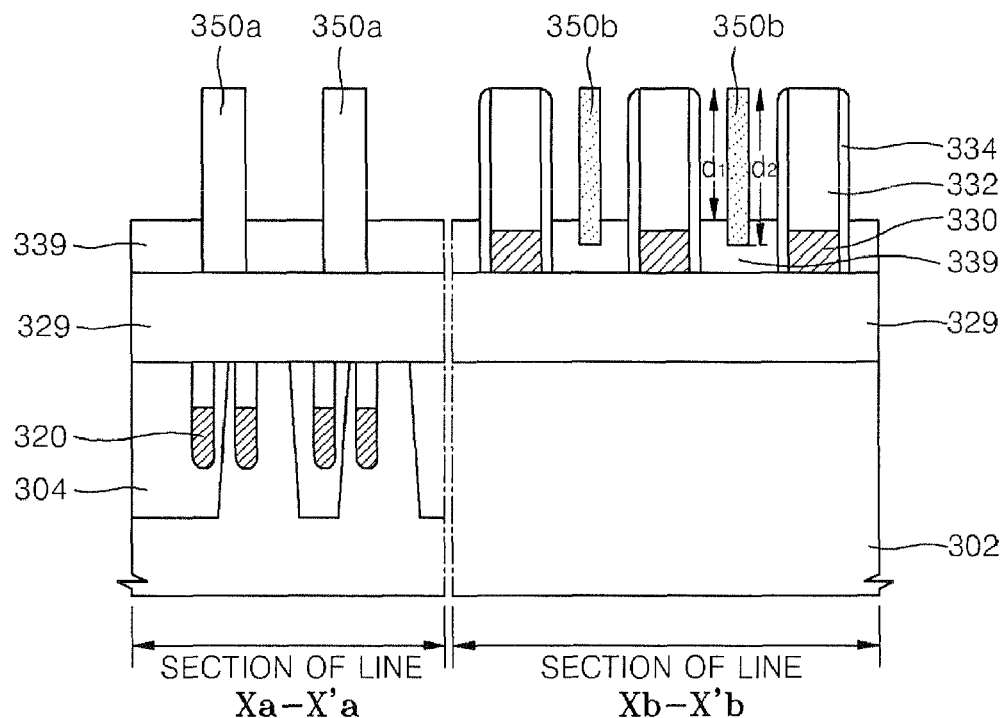

Referring to FIG. 11G, a predetermined portion of the sidewalls of the first and second insulating lines 350a and 350b of the contact barriers 350 may be exposed by removing a portion of the second interlayer dielectric layer 339 exposed between the contact barriers 350 and the second capping layer 332 and second insulating spacer 324 covering the bit lines 330. In one embodiment, the second interlayer dielectric layer 339 may be partially removed using a wet etching process in which the second capping layer 332, second insulating spacer 324 and contact barriers 350 function as an etching mask. As exemplarily illustrated in FIG. 11G, the depth d1 to which the second interlayer dielectric layer 339 is etched below the top surface of the second insulating lines 350b is less than the distance d2 from the top surface of the second insulating lines 350b to the bottom surface of the second insulating lines 350b.

Figure 11H:
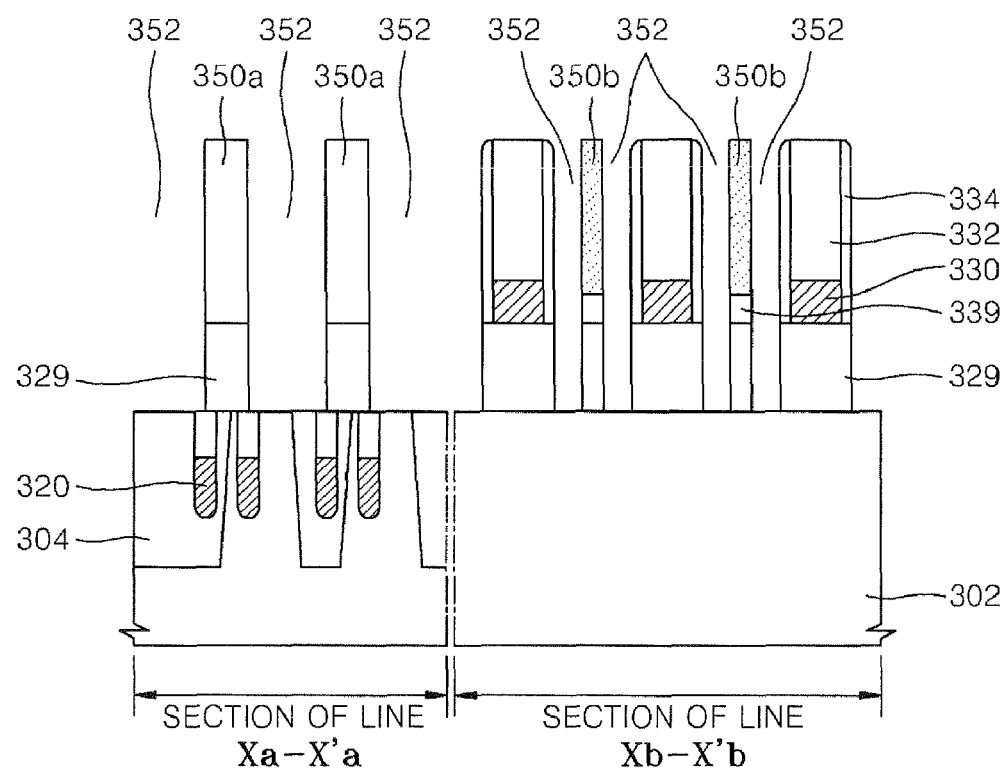

Referring to FIG. 11H, buried contact holes 352 exposing the active regions 310 of the semiconductor substrate 302 are formed by removing portions of the first and second interlayer dielectric layers 329 and 339 exposed between the contact barriers 350, the second capping layer 332 and the second insulating spacer 334 covering the bit lines 330 using an anisotropic dry etching process in which the contact barriers 350, the second capping layer 332 and the second insulating spacer 334 function as an etching mask.

Because at least a portion of the second interlayer dielectric layer 339 was previously removed through a wet etching process, and because a dry etching process for forming the buried contact hole 352 is performed as described with reference to FIG. 11H, the total thickness of the first and second interlayer dielectric layers 329 and 339 to be removed through the dry etching process is greatly reduced. Thus, the initial thickness and initial section profile of the second capping layer 332 and second insulating spacer 334 covering the bit line 330 can remain substantially unchanged even after forming the buried contact hole 352.

Thereafter, buried contacts 360 connected to the active regions 310 are formed, yielding the structure shown in FIG. 10. In one embodiment, the buried contacts 360 are formed by completely filling the buried contact hole 352 with a conductive material (e.g., doped poly-silicon) and covering the second capping layer 332 and the contact barriers 350 with the conductive material. Next, the conductive material may be patterned (e.g., using an etchback or CMP process) such that the second capping layer 332 and the contact barriers 350 are exposed.

Because the initial thickness and initial section profile of the second capping layer 332 and second insulating spacer 334 covering the bit lines 330 remain substantially unchanged, a sufficient margin for insulation between the bit lines 330 and the buried contacts 360 can be ensured.

According to the embodiments exemplarily described above, a contact barrier defining a buried contact region together with the bit lines is formed after forming a plurality of bit lines and before forming buried contacts electrically connected to active regions between the bit lines. A wet etching process is performed using the bit lines and the contact barrier as an etching mask so as to form buried contact holes having a large aspect ratio in a region in which the buried contacts will be formed. Accordingly, at least a portion of an interlayer dielectric layer formed on the bit lines is removed using a wet etching process and the buried contact holes are then formed by performing a dry etching process until a conductive region of a semiconductor substrate is exposed. Alternatively, the interlayer dielectric layer formed on the bit lines is removed by performing only a wet etching process until the conductive region is exposed. Thus, the thickness of layers to be dry etched to form the buried contact holes is remarkably reduced even when forming buried contact holes having a large aspect ratio to form the buried contacts in a highly integrated semiconductor device. As a result, the initial thickness and initial section profile of insulating layers covering the bit lines can remain substantially unchanged even after forming the buried contact holes, thereby minimizing the consumption of the insulating layers covering the bit lines. After forming the buried contacts in the buried contact holes, a sufficient margin for insulation between the buried contact and the bit lines can be ensured.

The methods of manufacturing a semiconductor device as exemplarily described above may be easily applied to semiconductor devices having various layouts. Thus, even when manufacturing a highly scaled semiconductor device, when forming contacts having a large aspect ratio, a sufficient margin for insulation and a contact area can be ensured while preventing short circuits between the buried contacts and the bit lines adjacent to each other. Accordingly, failures generated due to the short circuits are minimized in a contact formation process, thereby performing a stable process and enhancing the reliability of the semiconductor device.

What follows are exemplary descriptions of embodiments of the present invention. It will be appreciated that these descriptions are exemplary and non-limiting.

According to some embodiments, a semiconductor device may be characterized as including a semiconductor substrate having active regions formed thereon; first conductive lines extending over at least one of the active regions along a first direction; second conductive lines extending over the first conductive lines along a second direction; a buried contact electrically connected to the at least one of the active regions, the buried contact disposed in a region defined between a first pair of adjacent ones of the first conductive lines and between a pair of adjacent ones of the second conductive lines; and first insulating lines extending over the first pair of adjacent ones of the first conductive lines along the first direction, wherein the first insulating lines define a width of the buried contact along the second direction.

The first insulating lines may partially overlap the first pair of adjacent ones of the first conductive lines. At least one of the first insulating lines may overlap one of the first conductive lines of the first pair of adjacent ones of the first conductive lines and overlap another of the first conductive lines adjacent to the first pair of adjacent ones of the first conductive lines.

The semiconductor device described above may further include a second insulating line extending along the second direction, wherein the second insulating line is spaced apart from the pair of adjacent ones of the second conductive lines.

In one embodiment, only one buried contact may be disposed between the first pair of adjacent ones of the first conductive lines and between the pair of adjacent ones of the second conductive lines. In another embodiment, a plurality of buried contacts may be disposed between the first pair of adjacent ones of the first conductive lines and between the pair of adjacent ones of the second conductive lines. In such an embodiment, the plurality of buried contacts are insulated from one another by the second insulating line. In one embodiment, the buried contact directly contacts the at least one active region.

In one embodiment, the first insulating line may include a nitride material.

The semiconductor device described above may further include a lower contact formed on the at least one of the active regions and disposed between the first pair of adjacent ones of the first conductive lines, wherein the buried contact is electrically connected to the at least one of the active regions through the lower contact.

According to some embodiments, a semiconductor device may be characterized as including a semiconductor substrate having active regions formed thereon; first conductive lines extending over the semiconductor substrate along a first direction; second conductive lines extending over the first conductive lines along a second direction; first contacts formed on corresponding ones of the active regions, the first contacts disposed between pairs of adjacent ones of the first conductive lines; second contacts electrically connected to corresponding ones of the first contacts, the second contacts disposed between pairs of adjacent ones of the second conductive lines; and first insulating lines extending over the first pair of adjacent ones of the first conductive lines along the first direction and disposed between pairs of adjacent ones of the second conductive lines, wherein the first insulating lines insulate adjacent ones of the second contacts.

The first insulating lines may define a width of the second contact along the second direction. The first insulating lines may overlap the first conductive lines. In one embodiment, one of the first insulating lines overlaps with only one of the first conductive lines. In another embodiment, one of the first insulating lines overlaps two adjacent ones of the first conductive lines. The first insulating lines may include a nitride material.

In one embodiment, one of the second contacts may be disposed between a pair of adjacent ones of the first conductive lines and between a pair of adjacent ones of the second conductive lines.

The semiconductor device described above may further include second insulating lines extending along the second direction and intersecting with the first insulating lines. One of the first insulating lines may overlap with two adjacent ones of the first conductive lines. In one embodiment, two second contacts may be disposed in a region defined between two adjacent first conductive lines and defined between the two adjacent second conductive lines. In such an embodiment, the second contacts may be insulated from one another by one of the second insulating lines.

In one embodiment, the first and second insulating lines include substantially the same material. In another embodiment, the first and second insulating lines include a nitride material.

The semiconductor device described above may further include a capping layer covering top surfaces of the second conductive lines; and an insulating spacer covering sidewalls of the second conductive lines, wherein a width of the second contacts along the first direction may be defined by the insulating spacers covering sidewalls of the pairs of adjacent ones of the second conductive lines. The capping layer and the insulating spacer may include substantially the same material as the first insulating lines. The capping layer and the insulating spacer may include a nitride material.

In one embodiment, a distance from the top surface of the semiconductor substrate to bottom surfaces of the insulating spacers is greater than a distance from the top surfaces of the semiconductor substrate to top surfaces of the first contacts. In another embodiment, a distance from the top surface of the semiconductor substrate to the bottom surfaces of the insulating spacers is less than a distance from the top surface of the semiconductor substrate to the top surfaces of the first contacts.

The semiconductor device described above may further include a capping layer covering top surfaces of the second conductive lines and insulating spacers sidewalls of the second conductive lines, wherein a width of one of the second contacts along the first direction may be defined by one of the second insulating lines and one of the insulating spacers covering the sidewall of one of the two adjacent second conductive lines. The capping layer and the insulating spacer may include substantially the same material as the contact barrier. The capping layer and the insulating spacer comprise a nitride material.

The semiconductor device described above may further include an interlayer dielectric layer formed in a region between the first insulating lines and the first conductive lines, the interlayer dielectric layer comprising a material different from the first insulating lines. The first insulating lines may include a nitride material and the interlayer dielectric layer may include an oxide material.

The semiconductor device described above may further include a capping layer covering the top surfaces of the first conductive lines, wherein the first insulating lines may contact the capping layer.

According to some embodiments, a method of manufacturing a semiconductor device may be characterized as forming first conductive lines extending along a first direction on a semiconductor substrate having a plurality of active regions defined thereon; forming second conductive lines extending over the first conductive lines along a second direction, the second conductive lines comprising top surfaces and sidewalls covered by an insulating layer; forming an interlayer dielectric layer on the second conductive lines; patterning the interlayer dielectric layer to form line-shaped first spaces extending along the first direction; forming first insulating lines in the first spaces, the first insulating lines comprising a material having an etching selectivity different from an etching selectivity of the interlayer dielectric layer; wet etching the interlayer dielectric layer using the insulating layer and the first insulating lines as an etching mask to form contact holes spaced apart from the second conductive lines; and filling a conductive material in the contact holes to form buried contacts electrically connected to the active regions.

In one embodiment, the contact holes may be formed by wet etching at least a portion of the interlayer dielectric layer using the insulating layer and first insulating lines as an etching mask; and removing material remaining on the active regions until the active regions of the semiconductor substrate are exposed in a region exposed by the insulating layer and the first insulating lines.

An anisotropic dry etching process may be used to remove a material remaining on the active regions.

After forming the first conductive lines, self-aligned contacts (SACs) may be formed on the active regions before forming the second conductive lines. The SACs may be self-aligned with respect to the first conductive lines and the buried contacts may be formed to contact the SACs.

In another embodiment, the contact holes may be formed by wet etching at least a portion of the interlayer dielectric layer using the insulating layer covering the second conductive lines and the first insulating lines as an etching mask; and anisotropically dry etching a material remaining on the SACs until the SACs are exposed in a region exposed by the insulating layer and the first insulating lines.

In another embodiment, the contact holes may be formed by wet etching a material remaining on the interlayer dielectric layer and the SACs using the insulating layer and the first insulating lines as an etching mask until top surfaces of the SACs are exposed.

After forming the interlayer dielectric layer, second insulating lines extending along the second direction on the first interlayer dielectric layer may be formed before forming the first spaces. The insulating layer and the first and second insulating lines may be used as an etching mask for the purpose of wet etching the interlayer dielectric layer. During forming the interlayer dielectric layer, recesses extending parallel with the second conductive lines may be formed on a top surface of the interlayer dielectric and the second insulating lines are formed in the recesses. The first and second insulating lines may include substantially the same material. The interlayer dielectric layer may include an oxide material and each of the insulating layer and the first and second insulating lines may include a nitride material.

According to some embodiments, a method of manufacturing a semiconductor device may be characterized as forming first conductive lines extending along a first direction on a semiconductor substrate having a plurality of active regions defined thereon; forming first contacts contacting the active regions in regions between the first conductive lines; forming second conductive lines extending along a second direction over the first conductive lines and a first insulating layer covering a top surface and sidewalls of each of the second conductive lines; forming an interlayer dielectric layer on the first insulating layer; patterning the interlayer dielectric layer to form a plurality of line-shaped first spaces extending along the first direction in a region between two adjacent first contacts on the first conductive lines; forming first insulating lines in the first spaces the first insulating lines comprising a material having an etching selectivity different from the interlayer dielectric layer; removing at least a portion of the interlayer dielectric layer exposed between the first insulating layer and the first insulating lines through a primary wet etching process using the first insulating layer and the first insulating lines as an etching mask; removing a material remaining on the first contacts in a region exposed by the first insulating layer and the first insulating lines to form contact holes exposing top surfaces of the first contacts between the second conductive lines and the first insulating lines after performing the primary wet etching process; and forming second contacts connected to the first contacts by filling a conductive material in the contact holes.

The first insulating layer and the first insulating lines may include a nitride material.

In one embodiment, the material remaining on the first contacts may be removed using a secondary anisotropic dry etching process to form the contact holes after performing the primary wet etching process.

In another embodiment, the material remaining on the first contacts may be removed using a secondary wet etching process to form the contact holes after performing the primary wet etching process. The primary and secondary wet etching processes may be continuously performed under the same etching conditions.

In one embodiment, the first insulating layer may include a capping layer covering the top surface of the second conductive lines and an insulating spacer covering the sidewalls thereof. The insulating spacer may be formed such that a distance from a top surface of the semiconductor substrate to bottom surfaces of the insulating spacers is less than a distance from the top surface of the semiconductor substrate to the top surfaces of the first contacts.

In one embodiment, the interlayer dielectric layer may be exposed on inner walls of the first spaces after forming the first spaces.

After forming the interlayer dielectric layer, a plurality of second insulating lines extending along the second direction in a region between two of the second conductive lines adjacent to each other in the plurality of second conductive lines in the state that the second insulating lines are spaced apart from the second conductive lines before forming the first insulating lines.

The interlayer dielectric layer may be formed by forming an oxide material covering the first insulating layer to a predetermined thickness on top and side portions of the second conductive lines such that a plurality of recesses defining a second space with a predetermined width between two second conductive lines adjacent to each other in the plurality of second conductive lines are formed on a top surface of the interlayer dielectric layer; and depositing a nitride material in the second space to form the second insulating lines. In one embodiment, the interlayer dielectric layer may be formed using an atomic layer deposition (ALD) process.

In one embodiment, the first spaces are formed such that a distance from the top surface of the semiconductor substrate to bottom surfaces of the first spaces is greater than a distance from the top surface of the semiconductor substrate to bottom surfaces of the second insulating lines.

According to an aspect of the present invention, there is provided a semiconductor device. The semiconductor device includes a semiconductor substrate having a plurality of active regions formed thereon; a plurality of first conductive lines extending along a first direction on the semiconductor substrate; a plurality of second conductive lines extending along a second direction perpendicular to the first direction on the first conductive lines. A buried contact is formed on the same level as the second conductive lines to be electrically connected to the active regions of the semiconductor substrate in each of the plurality of first regions defined by two of the first conductive lines adjacent to each other and two of the second conductive lines adjacent to each other. A contact barrier includes a plurality of insulating lines extending along at least one of the first and second directions on the first conductive lines so as to define a width of the buried contact in at least one of the first and second directions.

The contact barrier may include a plurality of first insulating lines extending along the first direction to partially overlap with the first conductive lines. The contact barrier may include a plurality of first insulating lines extending along the first direction on two of the first conductive lines adjacent to each other so as to simultaneously overlap with the two first conductive lines adjacent to each other in the plurality of conductive lines. The contact barrier may include a plurality of first insulating lines extending along the first direction to overlap with at least a portion of the first conductive lines and a plurality of second insulating lines extending along the second direction to be parallel with the second conductive lines while being spaced apart from the second conductive lines at a predetermined interval.

In the semiconductor device, one buried contact may be formed in every first region. A plurality of buried contacts may be formed in every first region. At this time, the plurality of buried contacts formed in the first region may be insulated from one another by the second insulating lines.

The buried contact may have the shape of a direct buried contact directly contact the active regions of the semiconductor substrate. When the semiconductor device further includes a plurality of contacts formed on the same level as the first conductive lines on the active regions positioned between two first conductive lines adjacent to each other in the plurality of first conductive lines, the buried contacts may be electrically connected to the active regions through the contacts.

According to another aspect of the present invention, there is provided a semiconductor device. The semiconductor device includes a semiconductor substrate having a plurality of active regions formed thereon; a plurality of first conductive lines extending along a first direction on the semiconductor substrate; a plurality of second conductive lines extending along a second direction perpendicular to the first direction on the first conductive lines; a plurality of first contacts respectively formed on the active regions between two first conductive lines adjacent to each other in the plurality of first conductive lines; a plurality of second contacts electrically connected respectively to the first contacts formed between two of the first conductive lines adjacent to each other in a region between the two of the first conductive lines adjacent to each other in the plurality of second conductive lines. A contact barrier is formed between two of the first contacts adjacent to each other in the plurality of first contacts in a region between the two second conductive lines adjacent to each other. The contact barrier includes a plurality of first insulating lines extending along the first direction in a space between two of the second contacts adjacent to each other in the plurality of second contacts formed in a region between the two second conductive lines adjacent to each other.

In the semiconductor device, a width of a section taken along the second direction in a longitudinal section of the second contacts may be defined by two contact barriers adjacent to each other in the plurality of contact barriers.

In the semiconductor device, the first insulating lines of the contact barrier may extend to overlap with the first conductive lines thereon when being observed from a top surface of the semiconductor substrate.

One of the first insulating lines may extend to overlap with only one of the first conductive lines when being observed from the top surface of the semiconductor substrate. One of the first insulating lines may extend to simultaneously overlap with two of the first conductive lines adjacent to each other when being observed from the top surface of the semiconductor substrate.

The contact barrier may further include a plurality of second insulating lines extending along the second direction in the region between the two second conductive lines adjacent to each other so as to have a plurality of intersection points with the first insulating lines. Two second contacts may be formed in every region defined by the two first conductive lines adjacent to each other in the region between the two second conductive lines adjacent to each other. The first and second insulating lines may be of the same material as each other.

The semiconductor device may further include a capping layer covering a top surface of the second conductive lines and an insulating spacer covering both sidewalls of the second conductive lines. At this time, a width of a section taken along the first direction in a longitudinal section of the second contacts may be defined by the insulating spacers covering the respective sidewalls of the two second conductive lines adjacent to each other therebetween. A distance from the top surface of the semiconductor substrate to a bottom surface of the insulating spacer may be greater than that from the top surface of the semiconductor substrate to a top surface of the first contacts. A distance from the top surface of the semiconductor substrate to the bottom surface of the insulating spacer may be less than that from the top surface of the semiconductor substrate to the top surface of the first contact.

According to another aspect of the present invention, there is a provided a method of manufacturing a semiconductor device. In the method, a plurality of first conductive lines extending along parallel with one another in a first direction are formed on a semiconductor substrate having a plurality of active regions defined thereon. A plurality of second conductive lines extending along parallel with one another in a second direction perpendicular to the first direction and having top surfaces and sidewalls, covered by an insulating layer, are formed on the first conductive lines. An interlayer dielectric layer is formed on the second conductive lines. A plurality of line-shaped first spaces extending along parallel with one another in the first direction are formed on the first conductive lines by patterning the interlayer dielectric layer. A plurality of first insulating lines made of a material having an etching selectivity different from the interlayer dielectric layer are formed in the first spaces. A plurality of contact holes spaced apart from the second conductive lines are formed on the same level as the second conductive lines by wet etching the interlayer dielectric layer using the insulating layer covering the second conductive lines and the first insulating lines as an etching mask. Buried contacts electrically connected to the active regions by filling a conductive material are formed by filling a conductive material in the contact holes.

In the method, the forming of the contact holes may include wet etching at least a portion of the interlayer dielectric layer using the insulating layer covering the second conductive lines and first insulating lines as an etching mask; and removing a material remaining on the active regions until the active regions of the semiconductor substrate are exposed in a region exposed by the insulating layer covering the second conductive lines and the first insulating lines. An anisotropic dry etching process may be used to remove the material remaining on the active regions. The forming of the contact holes may include wet etching a material remaining on the interlayer dielectric layer and the SACs using the insulating layer covering the second conductive lines and the first insulating lines as an etching mask until top surfaces of the SACs are exposed.

After forming the interlayer dielectric layer, the method may further include forming a plurality of second insulating lines extending along parallel with one another to the second direction on the first interlayer dielectric layer before forming the first spaces. At this time, the insulating layer covering the second conductive lines and the first and second insulating lines may be used as an etching mask for the purpose of wet etching the interlayer dielectric layer.

According to another aspect of the present invention, there is provided a method of manufacturing a semiconductor device. In the method, a plurality of first conductive lines extending along parallel with one another in a first direction are formed on a semiconductor substrate having a plurality of active regions defined thereon. A plurality of first contacts contacting the active regions are formed in regions between the first conductive lines. A plurality of second conductive lines extending along a second direction perpendicular to the first direction are formed on the first conductive lines and a first insulating layer covering a top surface and sidewalls of each of the second conductive lines. An interlayer dielectric layer is formed on the first insulating layer. A plurality of line-shaped first spaces extending along the first direction in a region between two of the first contacts adjacent to each other in the plurality of first contacts are formed on the first conductive lines by patterning the interlayer dielectric layer. A plurality of first insulating lines formed of a material having an etching selectivity different from the interlayer dielectric layer are formed in the first spaces. At least a portion of the interlayer dielectric layer exposed between the first insulating layer and the first insulating lines is removed through a primary wet etching process using the first insulating layer and the first insulating lines as an etching mask. After performing the primary wet etching process, a material remaining on the first contacts is removed in a region exposed by the first insulating layer and the first insulating lines to form a plurality of contact holes exposing a top surface of the first contacts between the second conductive lines and the first insulating lines. A plurality of second contacts connected to the first contacts are formed by filling a conductive material in the contact holes.

According to the present invention, when forming contact holes in a space between a plurality of conductive lines to form contacts having a large aspect ratio between the plurality of conductive lines in a highly integrated semiconductor device, a wet etching process is used to minimize an amount of dry etching. Accordingly, the consumption of an insulating layer protecting a conductive layer due to etching is minimized, so that the initial thickness and initial section profile of the insulating layer can be maintained almost as they are, and a sufficient margin for insulation between the conductive line and the contact can be ensured.

While exemplary embodiments of the present invention have been particularly shown and described above, it will be understood by those of ordinary skill in the art that various changes in form and details may be made therein without departing from the spirit and scope of the present invention as defined by the following claims.

What is claimed is:

1. A semiconductor device comprising:
   a semiconductor substrate having active regions formed thereon;
   first conductive lines extending over at least one of the active regions along a first direction;
   second conductive lines extending over the first conductive lines along a second direction;
   a buried contact electrically connected to the at least one of the active regions, the buried contact disposed within a region defined between a first pair of adjacent ones of the first conductive lines and between a pair of adjacent ones of the second conductive lines; and
   first insulating lines extending over the first pair of adjacent ones of the first conductive lines along the first direction, wherein the first insulating lines define a width of the buried contact along the second direction.

2. The semiconductor device of claim 1, wherein the first insulating lines partially overlap the first pair of adjacent ones of the first conductive lines.

3. The semiconductor device of claim 1, wherein at least one of the first insulating lines overlaps one of the first conductive lines in the first pair of adjacent ones of the first conductive lines and overlaps another of the first conductive lines adjacent to the first pair of adjacent ones of the first conductive lines.

4. The semiconductor device of claim 1, further comprising a second insulating line extending along the second direction, wherein the second insulating line is spaced apart from the pair of adjacent ones of the second conductive lines.

5. The semiconductor device of claim 4, wherein a plurality of buried contacts are disposed in the region defined between the first pair of adjacent ones of the first conductive lines and between the pair of adjacent ones of the second conductive lines.

6. The semiconductor device of claim 5, wherein the plurality of buried contacts are insulated from one another by the second insulating line.

7. The semiconductor device of claim 1, wherein only one buried contact is disposed within the region defined between the first pair of adjacent ones of the first conductive lines and between the pair of adjacent ones of the second conductive lines.

8. The semiconductor device of claim 1, wherein the buried contact directly contacts the at least one of the active regions.

9. The semiconductor device of claim 1, further comprising a lower contact formed on the at least one of the active regions and disposed between the first pair of adjacent ones of the first conductive lines, wherein the buried contact is electrically connected to the at least one of the active regions through the lower contact.

10. A semiconductor device comprising:
    a semiconductor substrate having active regions formed thereon;
    first conductive lines extending over the semiconductor substrate along a first direction;
    second conductive lines extending over the first conductive lines along a second direction;
    first contacts formed on corresponding ones of the active regions, the first contacts disposed between pairs of adjacent ones of the first conductive lines;
    second contacts electrically connected to corresponding ones of the first contacts, the second contacts disposed between pairs of adjacent ones of the second conductive lines; and
    first insulating lines extending over the first pair of adjacent ones of the first conductive lines along the first direction and disposed between pairs of adjacent ones of the second conductive lines, wherein the first insulating lines insulate adjacent ones of the second contacts, and
    wherein one of the first insulating lines overlaps with only one of the first conductive lines.

11. A semiconductor device comprising:
    a semiconductor substrate having active regions formed thereon;
    first conductive lines extending over the semiconductor substrate along a first direction;
    second conductive lines extending over the first conductive lines along a second direction;
    first contacts formed on corresponding ones of the active regions, the first contacts disposed between pairs of adjacent ones of the first conductive lines;
    second contacts electrically connected to corresponding ones of the first contacts, the second contacts disposed between pairs of adjacent ones of the second conductive lines;
    first insulating lines extending over the first pair of adjacent ones of the first conductive lines along the first direction and disposed between pairs of adjacent ones of the second conductive lines, wherein the first insulating lines insulate adjacent ones of the second contacts; and
    second insulating lines extending along the second direction and intersecting with the first insulating lines.

12. The semiconductor device of claim 11, wherein the first and second insulating lines comprise substantially the same material.

13. The semiconductor device of claim 11, further comprising:
    a capping layer covering top surfaces of the second conductive lines; and
    insulating spacers covering sidewalls of the second conductive lines,
    wherein a width of one of the second contacts along the first direction is defined by one of the second insulating lines and one of the insulating spacers covering the sidewall of one of the two adjacent second conductive lines.

14. The semiconductor device of claim 10, further comprising:
    a capping layer covering top surfaces of the second conductive lines; and
    an insulating spacer covering sidewalls of the second conductive lines, wherein a width of the second contacts along the first direction is defined by the insulating spacers covering sidewalls of the pairs of adjacent ones of the second conductive lines.

15. The semiconductor device of claim 14, wherein a distance from the top surface of the semiconductor substrate to bottom surfaces of the insulating spacers is greater than a distance from the top surfaces of the semiconductor substrate to top surfaces of the first contacts.

16. The semiconductor device of claim 14, wherein a distance from the top surface of the semiconductor substrate to the bottom surfaces of the insulating spacers is less than a distance from the top surface of the semiconductor substrate to the top surfaces of the first contacts.

17. The semiconductor device of claim 10, further comprising:
an interlayer dielectric layer formed between the first insulating lines and the first conductive lines, the interlayer dielectric layer comprising a material different from the first insulating lines.

18. The semiconductor device of claim 10, further comprising a capping layer covering the top surfaces of the first conductive lines,
wherein the first insulating lines contact the capping layer.

* * * * *